(12) United States Patent
Wu et al.

(10) Patent No.: US 12,713,893 B2
(45) Date of Patent: Aug. 18, 2026

(54) CONDUCTIVE STRUCTURE IN SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Cai-Ling Wu, Hsinchu (TW); Hsiu-Wen Hsueh, Taichung City (TW); An-Jiao Fu, Taipei City (TW); Chii-Ping Chen, Hsinchu City (TW); Jen-Hung Wang, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 730 days.

(21) Appl. No.: 18/166,130

(22) Filed: Feb. 8, 2023

(65) Prior Publication Data

US 2024/0266279 A1 Aug. 8, 2024

(51) Int. Cl.

*H01L 23/522* (2006.01)
*H10W 20/00* (2026.01)

(Continued)

(52) U.S. Cl.

CPC ......... *H10W 20/42* (2026.01); *H10W 20/033* (2026.01); *H10W 20/056* (2026.01); *H10W 20/077* (2026.01); *H10W 20/081* (2026.01); *H10W 20/425* (2026.01); *H10W 20/435* (2026.01)

(58) Field of Classification Search

CPC ........... H01L 23/5226; H01L 21/76802; H01L 21/76834; H01L 21/76843; H01L 21/76877; H01L 23/5283; H01L 23/53223; H01L 21/76808; H01L 21/76811; H01L 21/76813; H01L 23/528; H01L 23/53238; H01L 21/76832; H01L 23/53295

See application file for complete search history.

(56) References Cited

U.S. PATENT DOCUMENTS

2008/0241575 A1* 10/2008 Lavoie .................. H10D 30/60 438/778
2021/0257293 A1* 8/2021 Lee .................. H01L 21/76829

(Continued)

*Primary Examiner* — Karen Kusumakar
(74) *Attorney, Agent, or Firm* — McClure, Qualey & Rodack, LLP

(57) ABSTRACT

A method for manufacturing a semiconductor structure is provided. The semiconductor structure includes an aluminum-containing layer and an etch stop layer formed over the aluminum-containing layer. The semiconductor structure further includes a carbon-containing dielectric layer formed over the etch stop layer. The semiconductor structure further includes a metal line formed in an upper portion of the carbon-containing dielectric layer. The semiconductor structure further includes a conductive via formed in a lower portion of the carbon-containing dielectric layer and through the etch stop layer and the aluminum-containing layer. The semiconductor structure further includes a barrier layer interposing the first sidewall of the metal line and carbon-containing dielectric layer and interposing the second sidewall of the conductive via and the carbon-containing dielectric layer.

20 Claims, 28 Drawing Sheets

(51) Int. Cl.
*H10W 20/41* (2026.01)
*H10W 20/42* (2026.01)

(56) References Cited

U.S. PATENT DOCUMENTS

2021/0327945 A1* 10/2021 Liao ...................... H10F 39/811
2022/0102343 A1* 3/2022 Mule' ................. H01L 23/5384
2022/0216102 A1* 7/2022 More ...................... H10P 95/00

* cited by examiner 112
118
116
114
130
126'
128
110
108
106
102
104
Z
X

R1F
126'
130
Y

Y1'
Y1
X1'
X1
118
126'
130
106

140
144X
142X
138
136
134
110
108
106
102
104
Z
X 144
110
142
134
136
138
144Y
142Y
Y

Y₁'
Y₁
X₁
X₁'

112
118
116
114
550'
126d
110
108
106
102
104
Z
X 112
118
116
114
110
126d
550'
108
106
102
104
Z
Y 112
550'
$Y_5'$
$Y_5$
$X_5$
$X_5'$
Y
X 552
118
116
114
126d
550'
554
554
554
554
110
108
106
102
104
Z
X 552
554
550'
108
106
102
104
118
116
114
110
126d
Z
Y $X_5'$
552
550'
554
$Y_5'$
$Y_5$
$X_5$
Y
X 100e
242
242
242
240e
234
244
238
$Y_7'$
$Y_7$
$X_7$
$X_7'$

Y
X
210
208
206
144
142
108
106
102
104
138
134
240e
238
234
244
242
110
140e

Z
Y
240e
210
208
206
140e
110
108
106
102
104
238
234
138
134

Z
X

CONDUCTIVE STRUCTURE IN SEMICONDUCTOR STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Over the past several decades, the semiconductor integrated circuit industry has experienced rapid growth. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Although existing processes for manufacturing semiconductor structures have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1 to 1K-1 and 1A-2 to 1K-2 are cross-sectional representations of various stages of forming a semiconductor structure 100 in accordance with some embodiments.

FIGS. 1A-3 to 1K-3 are top views of various stages of forming the semiconductor structure in accordance with some embodiments.

FIG. 1F-4 illustrates an enlarged cross-sectional view of the semiconductor structure of block $R_{1F}$ shown in FIG. 1F-2 in accordance with some embodiments.

FIG. 1K-4 illustrates an enlarged cross-sectional view of the semiconductor structure of block $R_{1K}$ shown in FIG. 1K-2 in accordance with some embodiments.

FIGS. 2-1 and 2-2 illustrate cross-sectional views of an intermediate stage of manufacturing the semiconductor structure in accordance with some other embodiments.

FIGS. 2-3 is a top view of an intermediate stage of manufacturing the semiconductor structure in accordance with some other embodiments.

FIGS. 3-1 and 3-2 illustrate cross-sectional views of an intermediate stage of manufacturing the semiconductor structure in accordance with some other embodiments.

FIGS. 3-3 illustrates a top view of an intermediate stage of manufacturing the semiconductor structure in accordance with some other embodiments.

FIGS. 4-1 and 4-2 illustrate cross-sectional views of an intermediate stage of manufacturing the semiconductor structure in accordance with some other embodiments.

FIGS. 4-3 illustrates a top view of an intermediate stage of manufacturing the semiconductor structure in accordance with some other embodiments.

FIGS. 5A-1 to 5H-1 and 5A-2 to 5H-2 are cross-sectional representations of various stages of forming a semiconductor structure in accordance with some embodiments.

FIGS. 5A-3 to 5H-3 are top views of various stages of forming the semiconductor structure in accordance with some embodiments.

FIGS. 6-1 and 6-2 illustrate cross-sectional views of an intermediate stage of manufacturing the semiconductor structure in accordance with some other embodiments.

FIGS. 6-3 illustrates a top view of an intermediate stage of manufacturing the semiconductor structure in accordance with some other embodiments.

FIGS. 7-1 and 7-2 illustrate cross-sectional views of a semiconductor structure in accordance with some other embodiments.

FIGS. 7-3 illustrates a top view of a semiconductor structure in accordance with some other embodiments.

FIGS. 8-1 and 8-2 illustrate cross-sectional representations of a semiconductor structure in accordance with some embodiments.

FIGS. 9-1 and 9-2 illustrate cross-sectional representations of a semiconductor structure in accordance with some embodiments.

DETAILED DESCRIPTION

Figures 1, 1A, 2, 3:
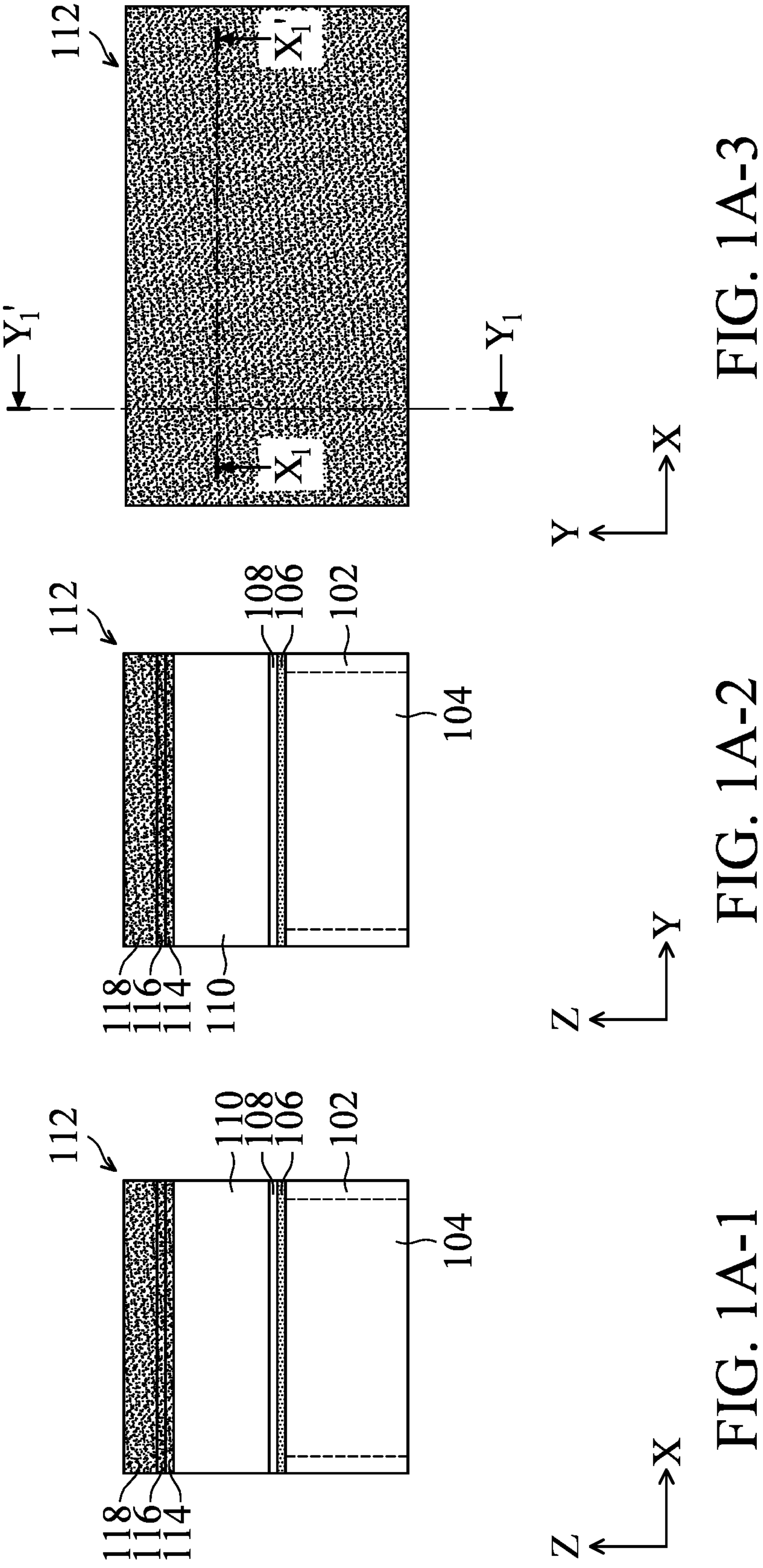
Figures 1, 1B, 2, 3:
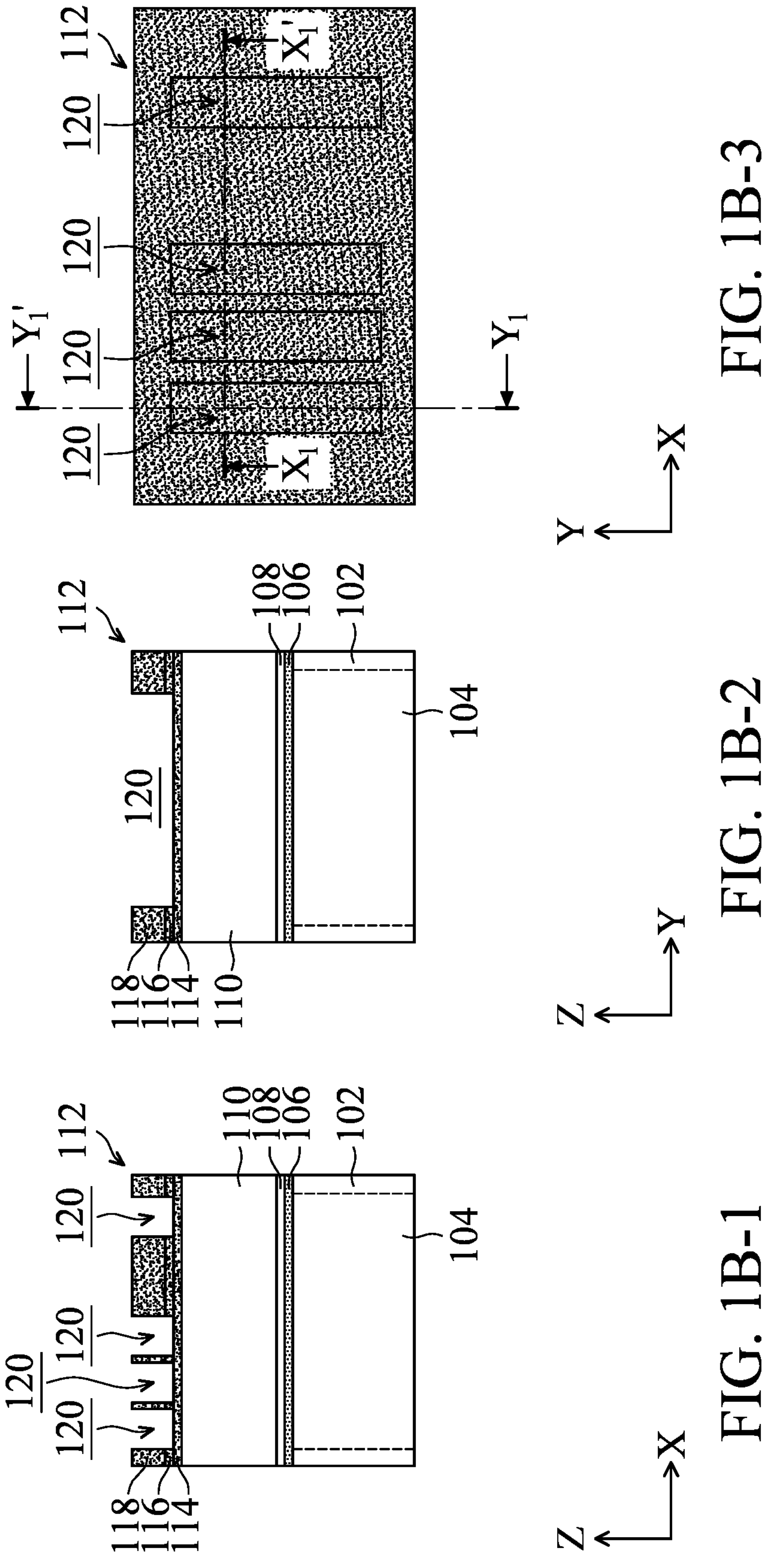
Figures 1, 1C, 2, 3:
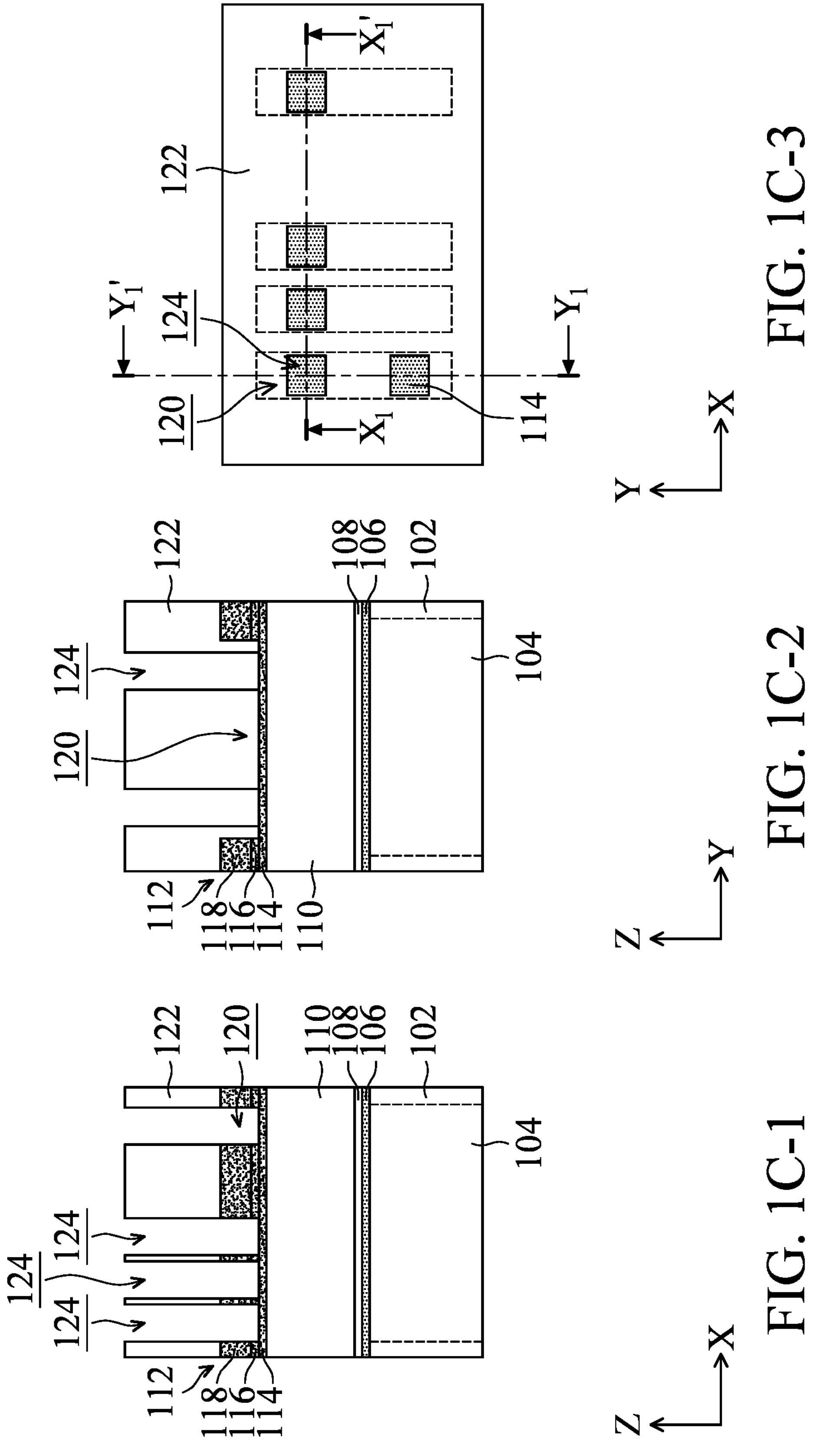
Figures 1, 1D, 2, 3:
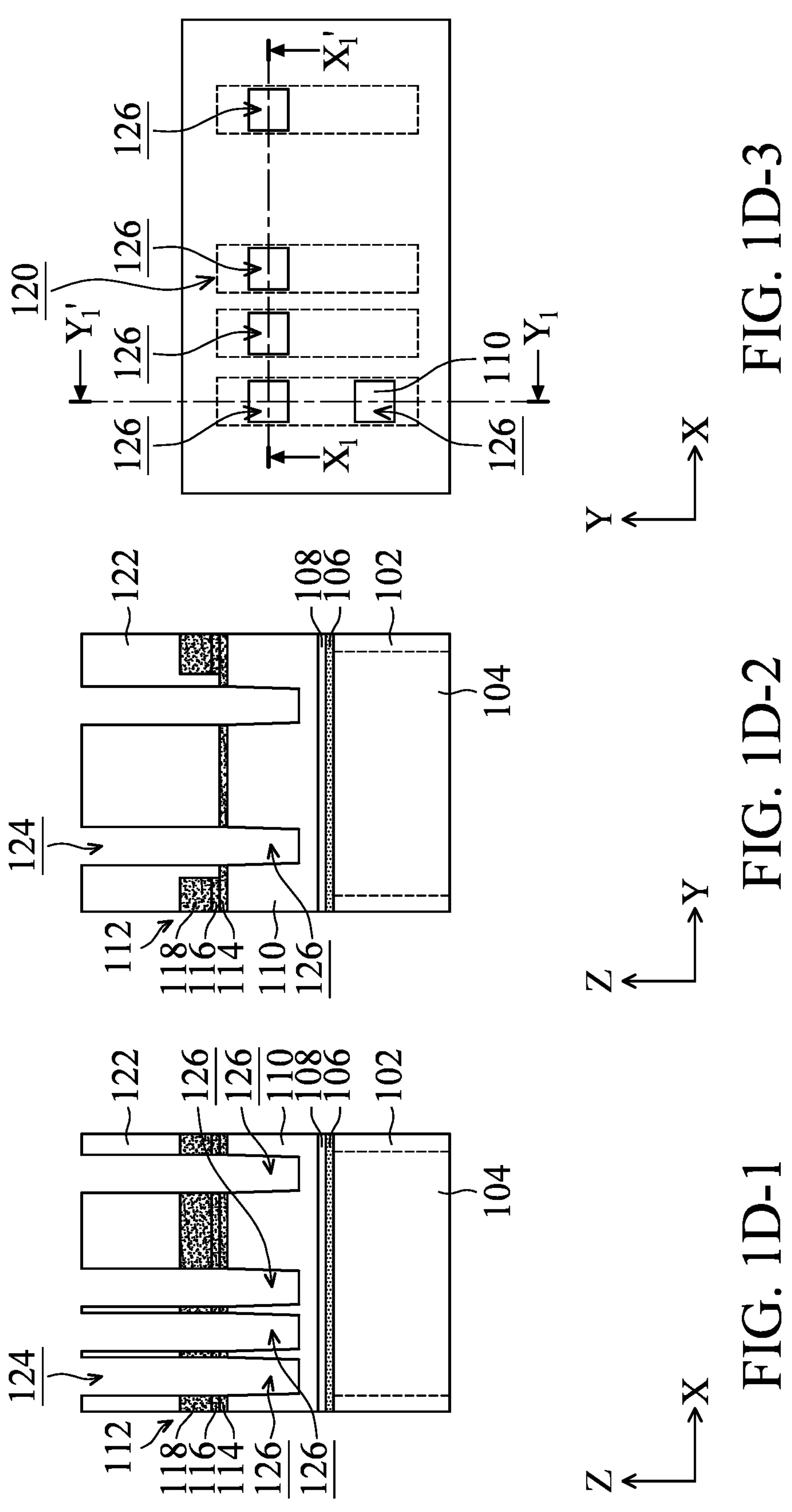
Figures 1, 1E, 2, 3:
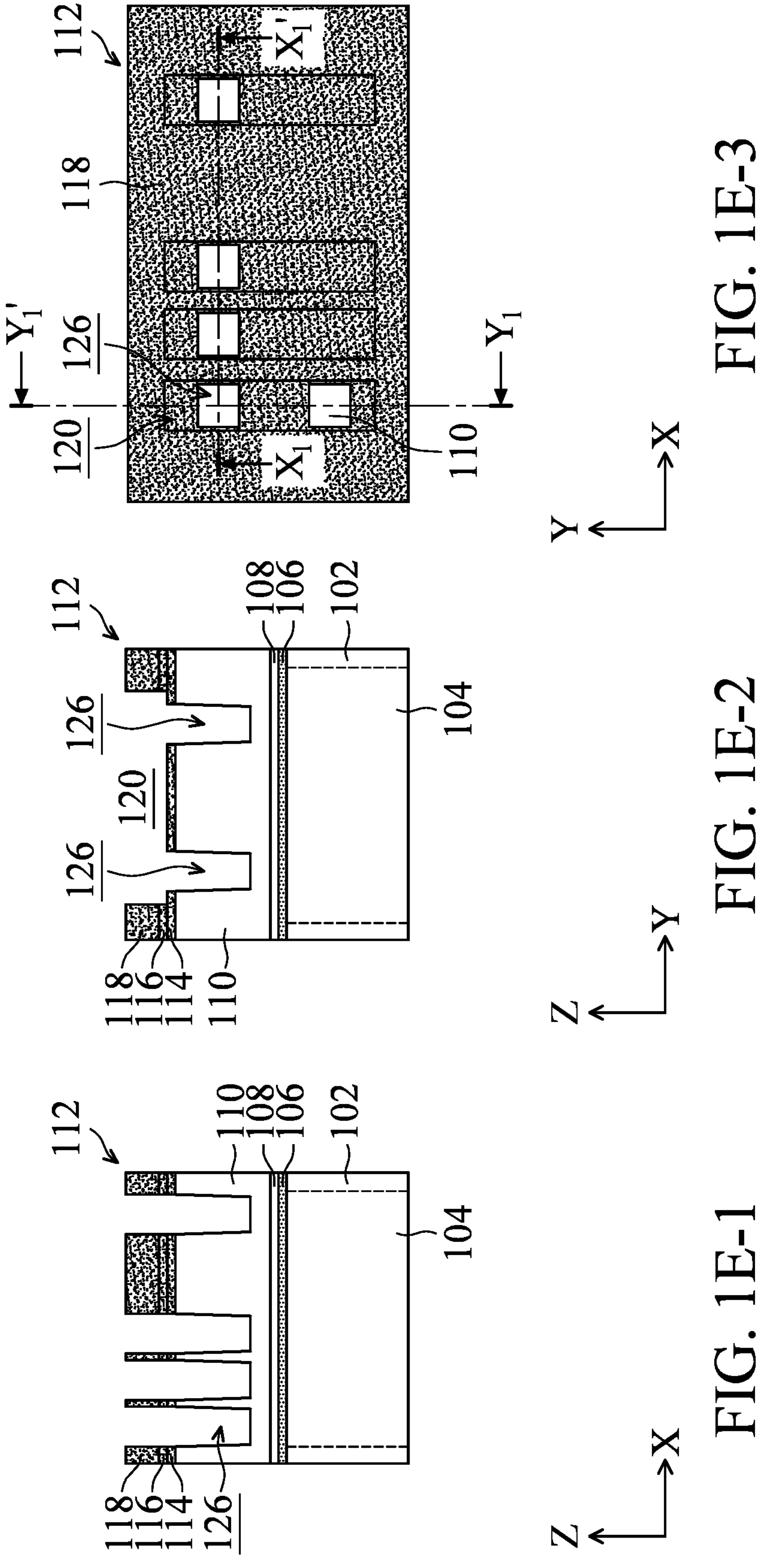

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments for forming a semiconductor structure are provided. The semiconductor structure may include an interconnect structure with conductive vias and metal lines embedded in dielectric layers. More specifically, a low k dielectric layer with a relatively high hardness may be formed and a line trench and a via opening may be formed in the low k dielectric layer. Afterwards, a conductive structure may be formed in the line trench and in the via opening. The low k dielectric layer may be a carbon-containing dielectric layer having a low dielectric constant (i.e. low k) and a relatively high hardness, so that the reliability of the interconnect structure may be improved.

In addition, an aluminum-containing layer and an etch stop layer may be formed under the carbon-containing dielectric layer. The aluminum-containing layer may have a relatively densified structure and therefore may prevent over-etching during the etching processes for forming the line trench and the via opening. Therefore, the elements formed below the aluminum-containing layer (e.g. other conductive structures) may be protected. Furthermore, the formation of the aluminum-containing layer may help to improve the time-dependent dielectric breakdown (TDDB) gamma's result.

Figures 1, 1F, 2, 3:
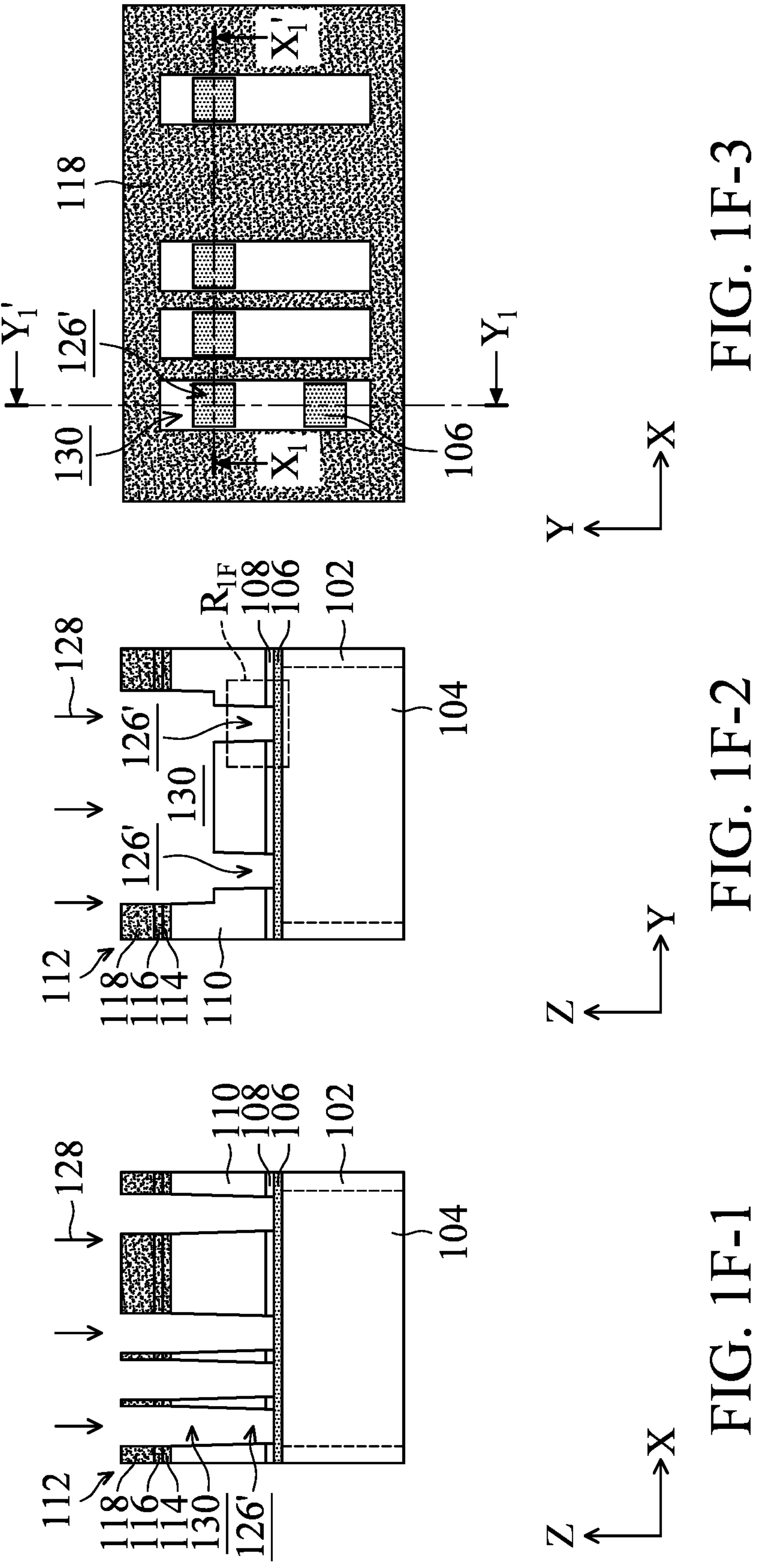
Figures 1, 1F, 2, 3, 4:
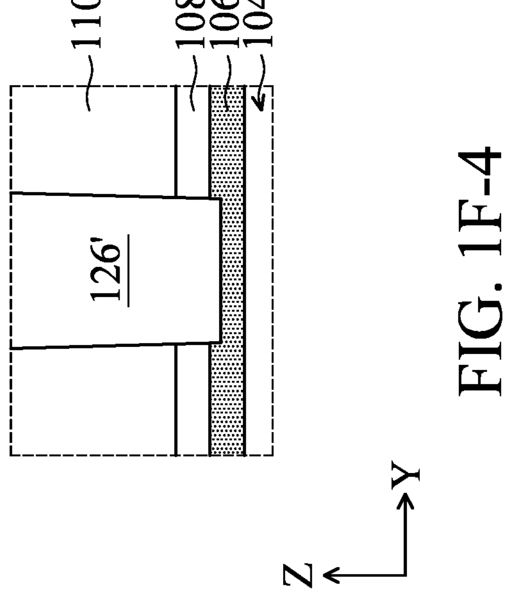
Figures 1, 1G, 2, 3:
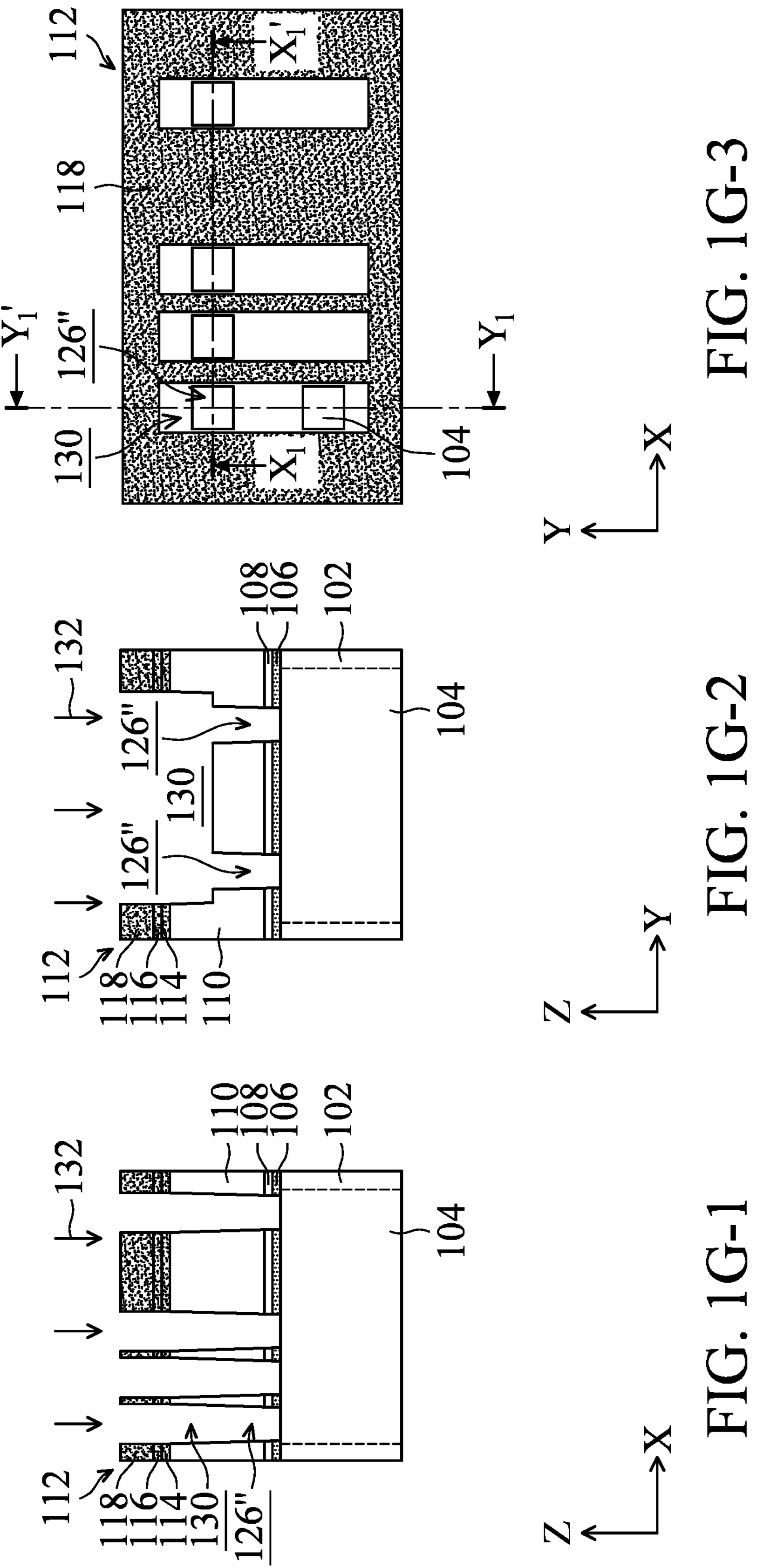
Figures 1, 1H, 2, 3:
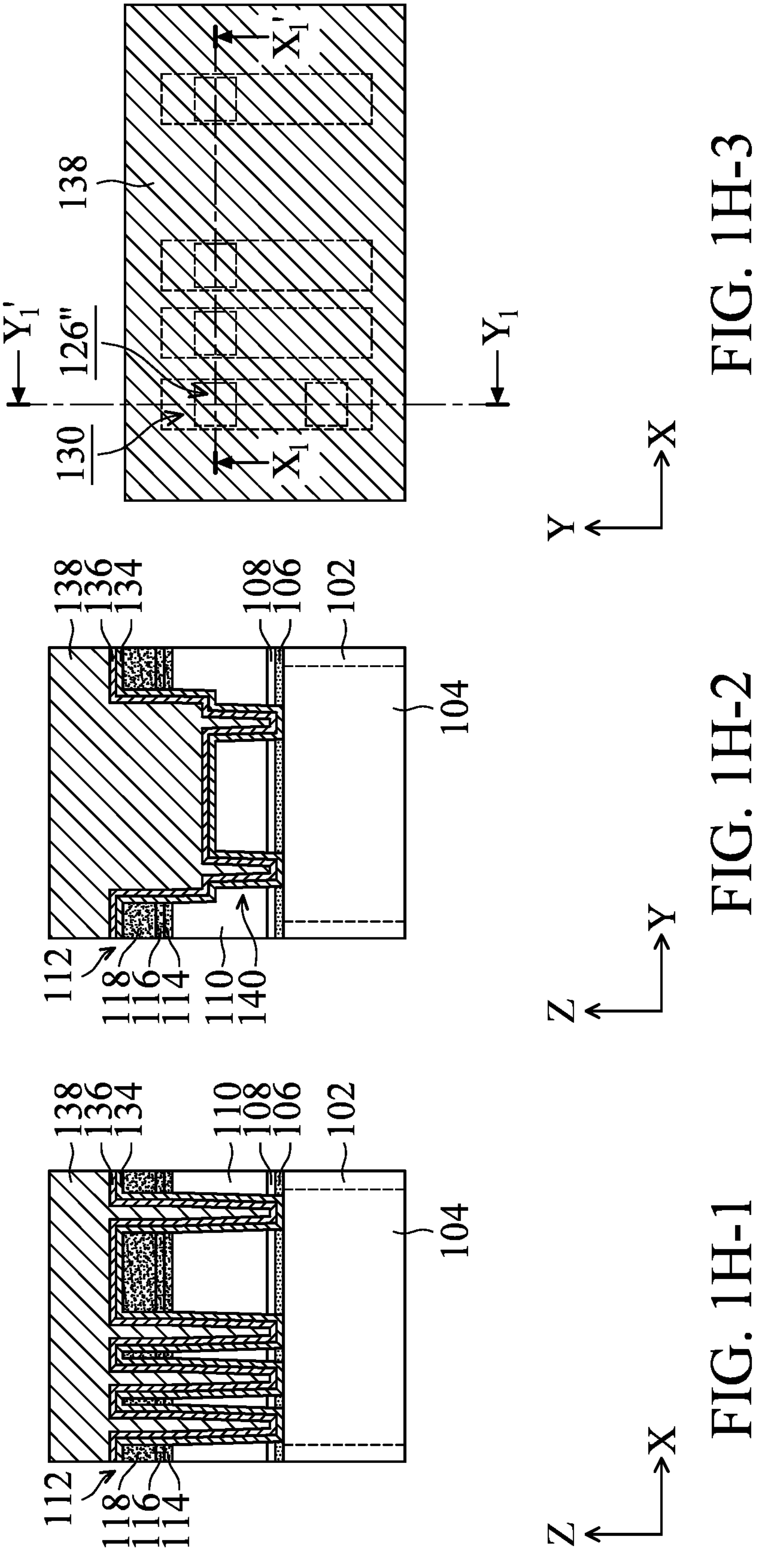
Figures 1, 1I, 2, 3:
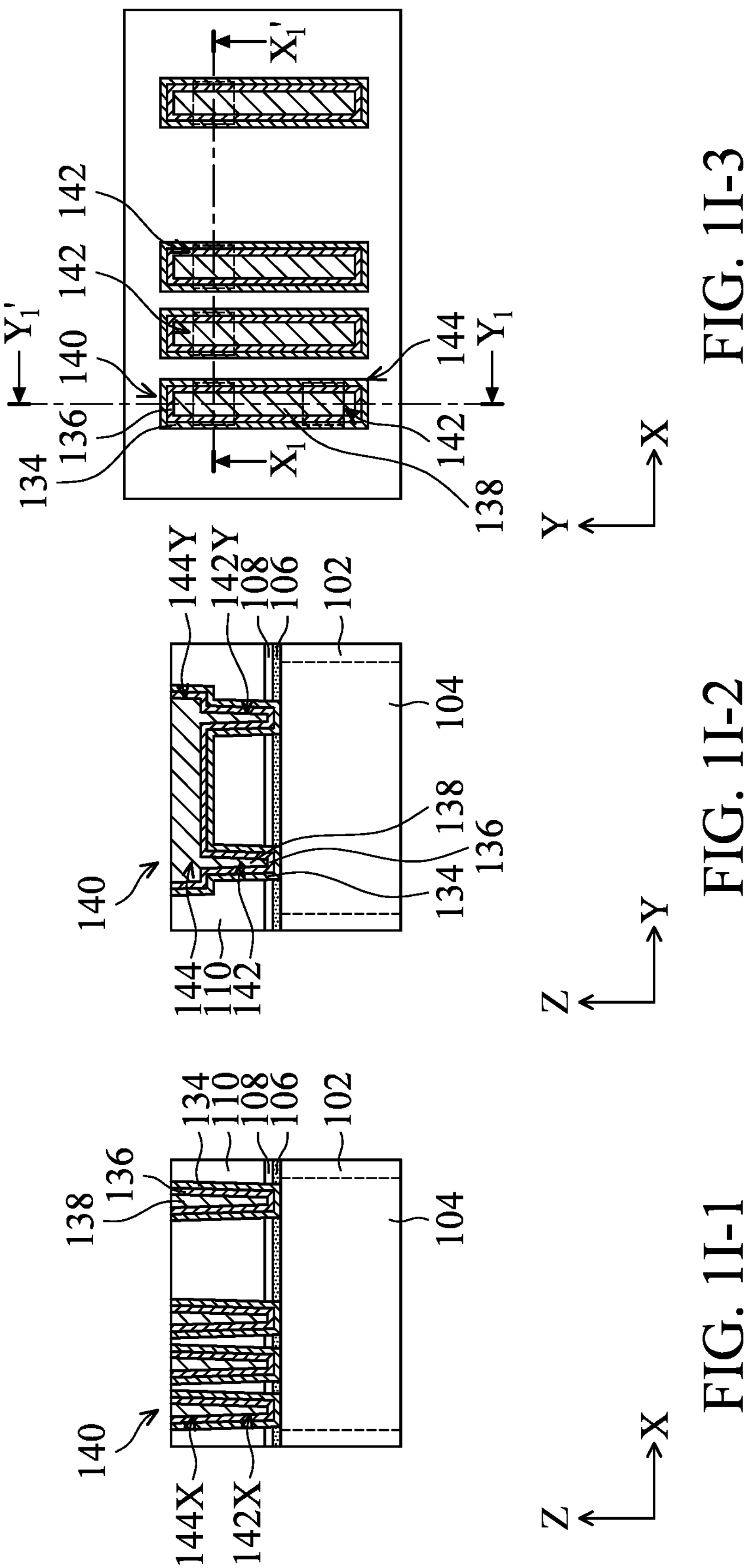
Figures 1, 1J, 2, 3:
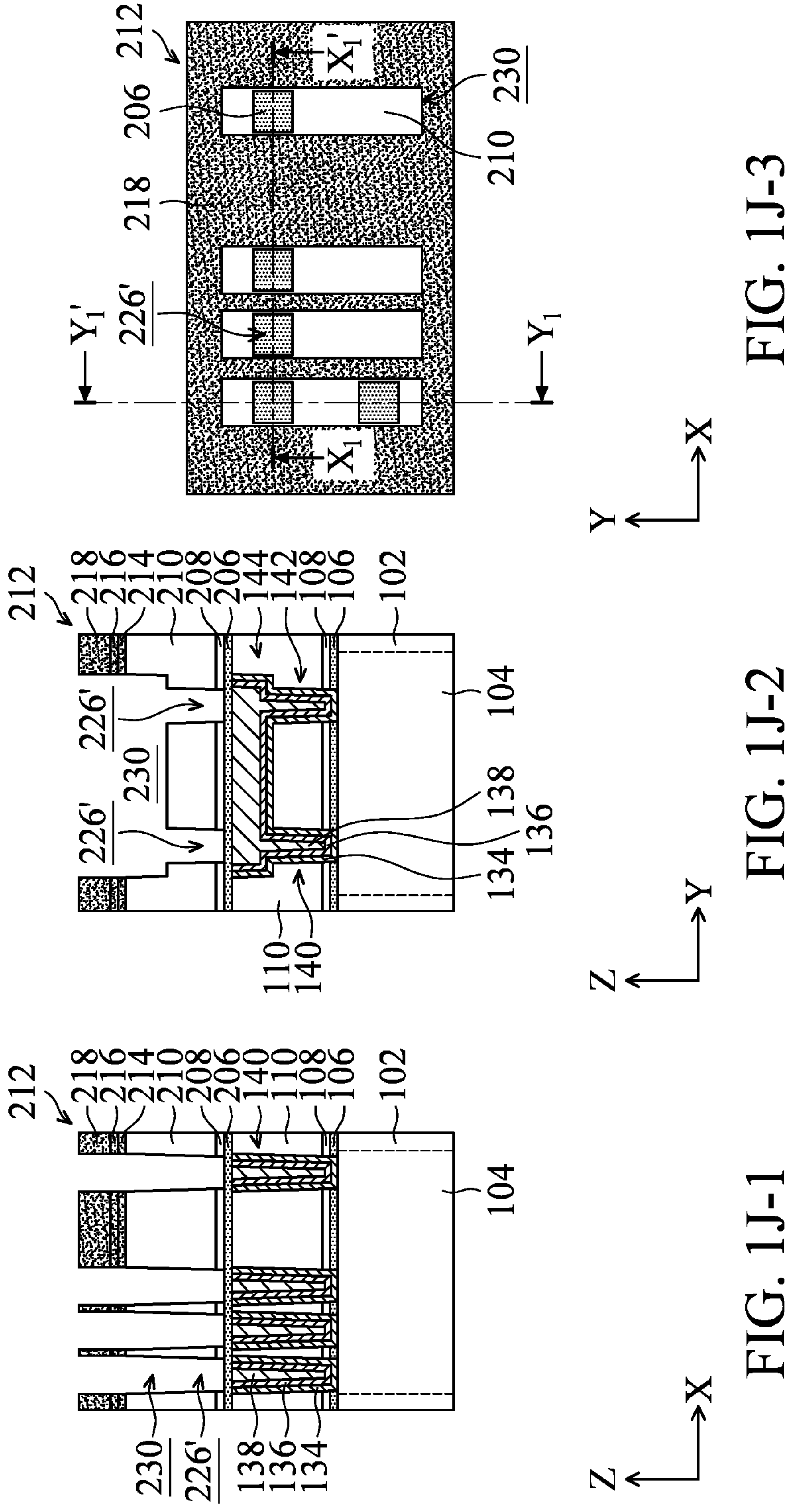
Figures 1, 1K, 2, 3:
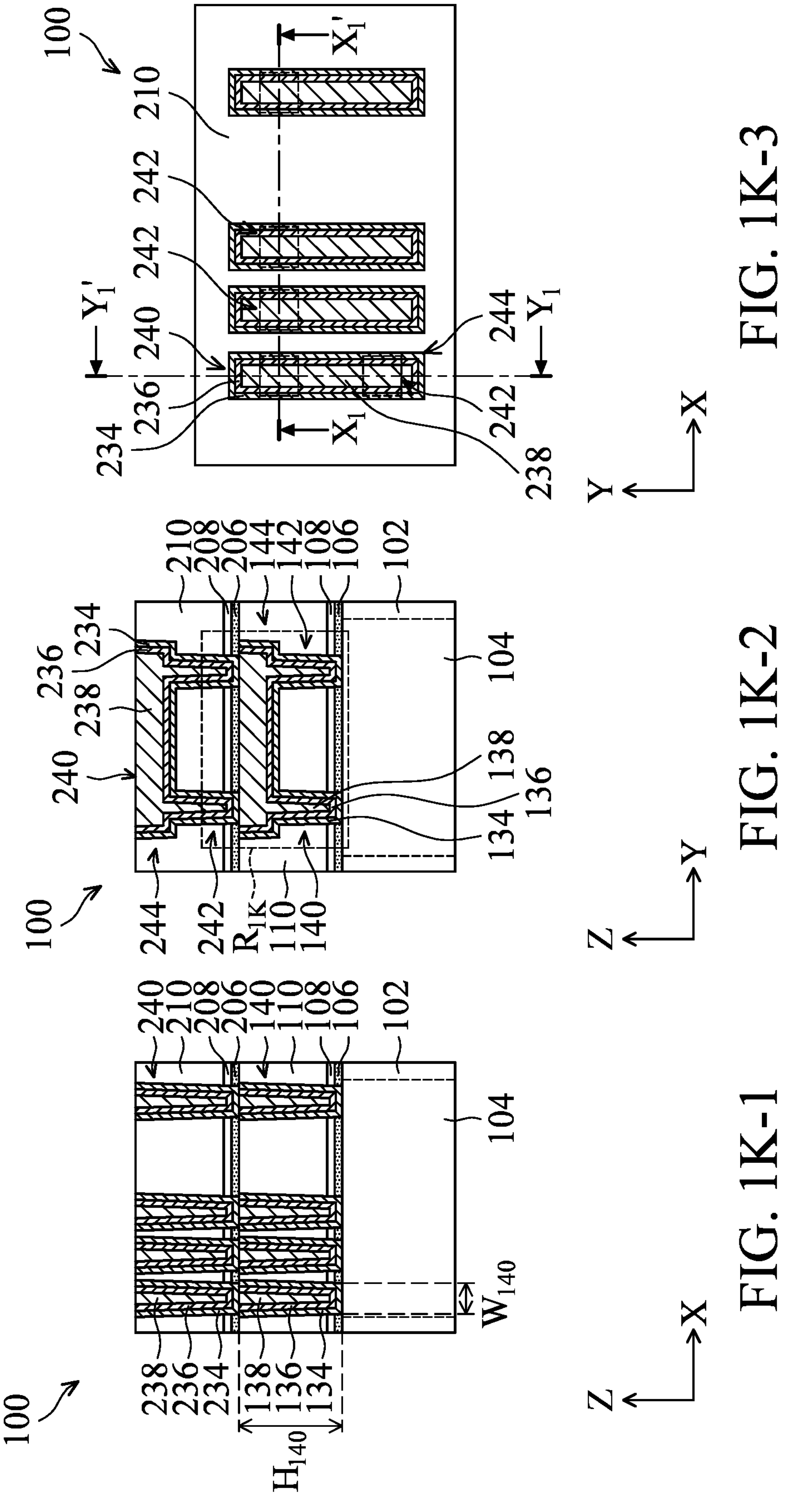
Figures 1, 1K, 2, 3, 4:
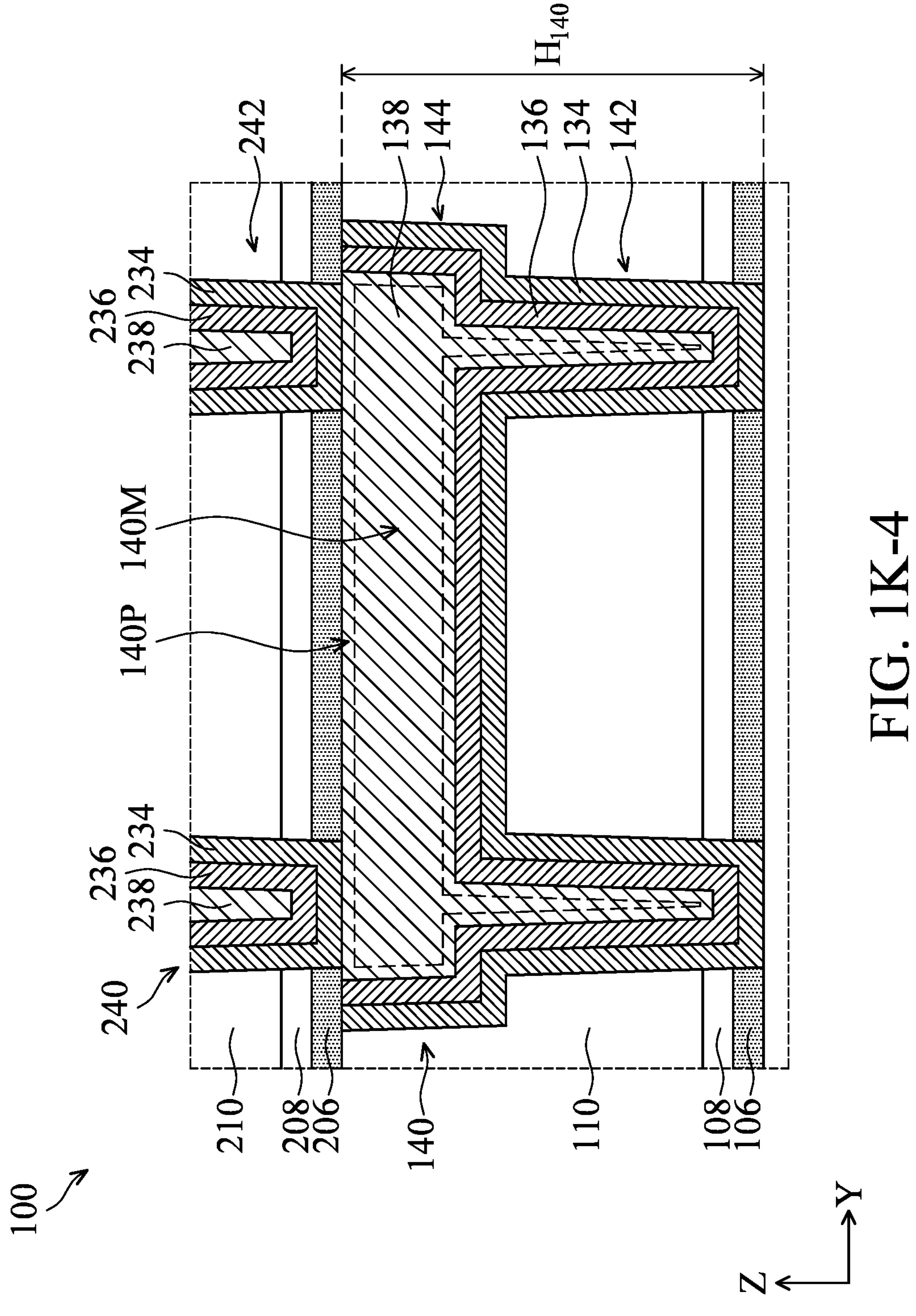
Figures 1, 2, 3:
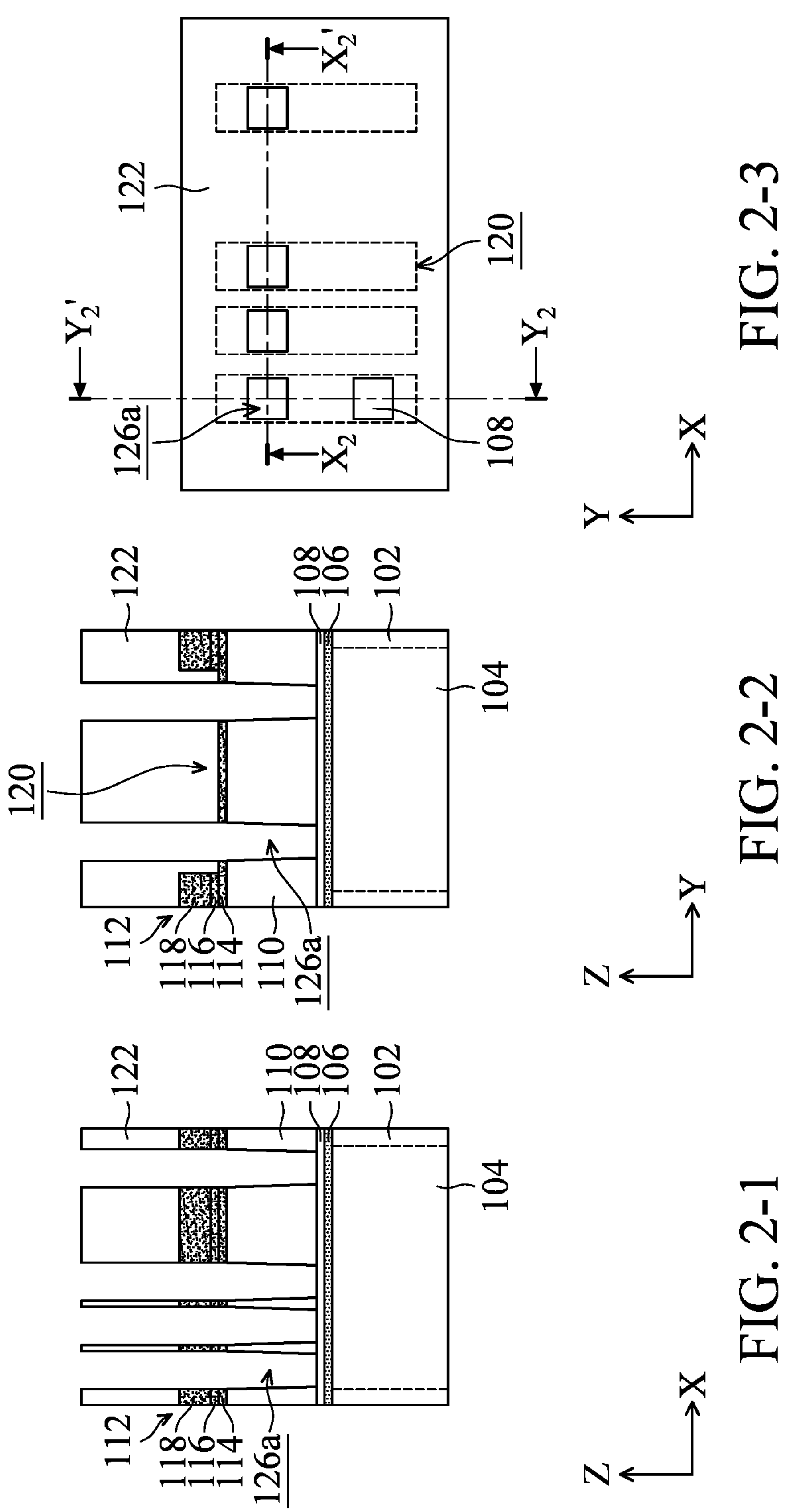
Figures 1, 2, 3:
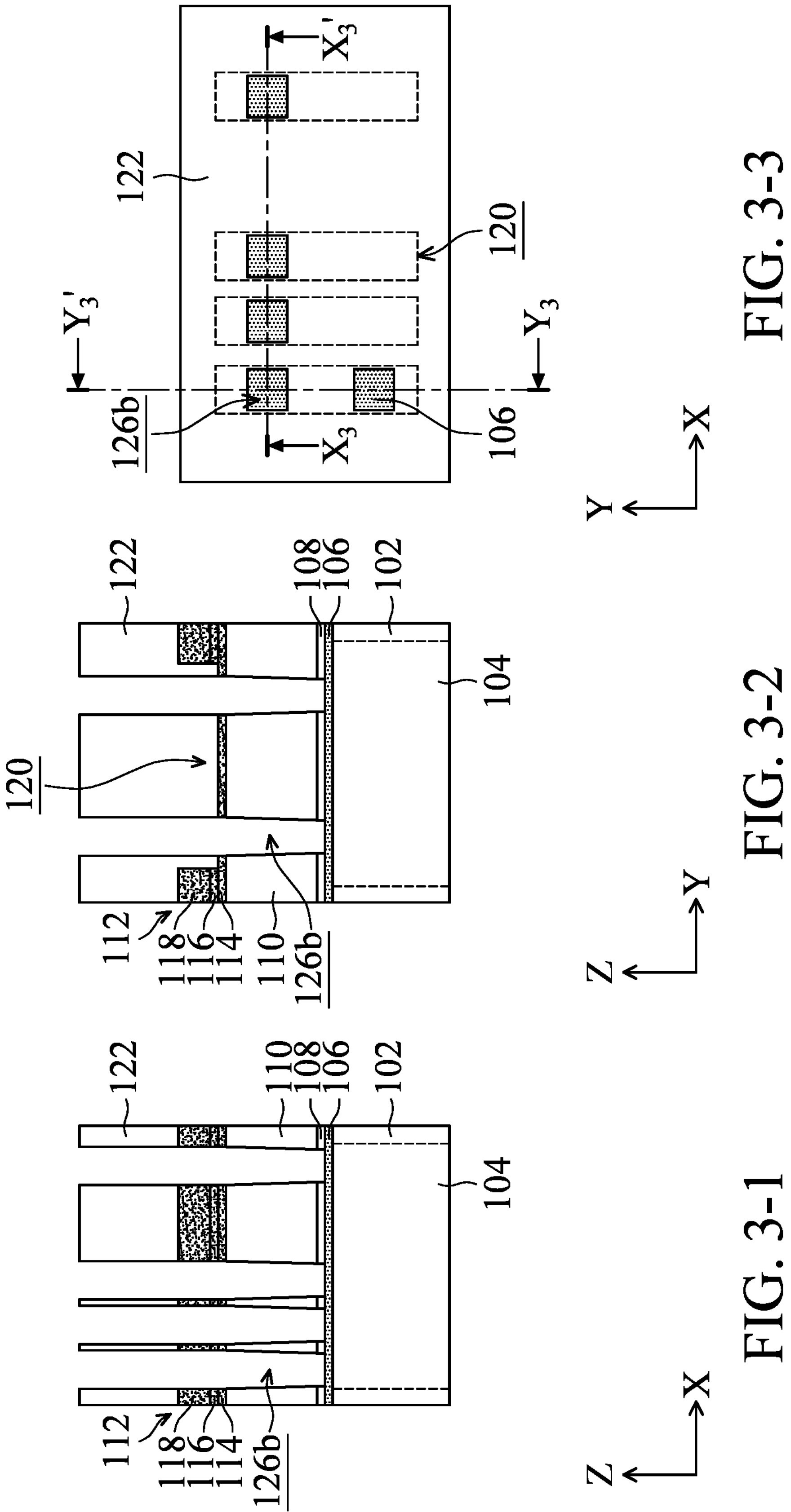
Figures 1, 2, 3, 4:
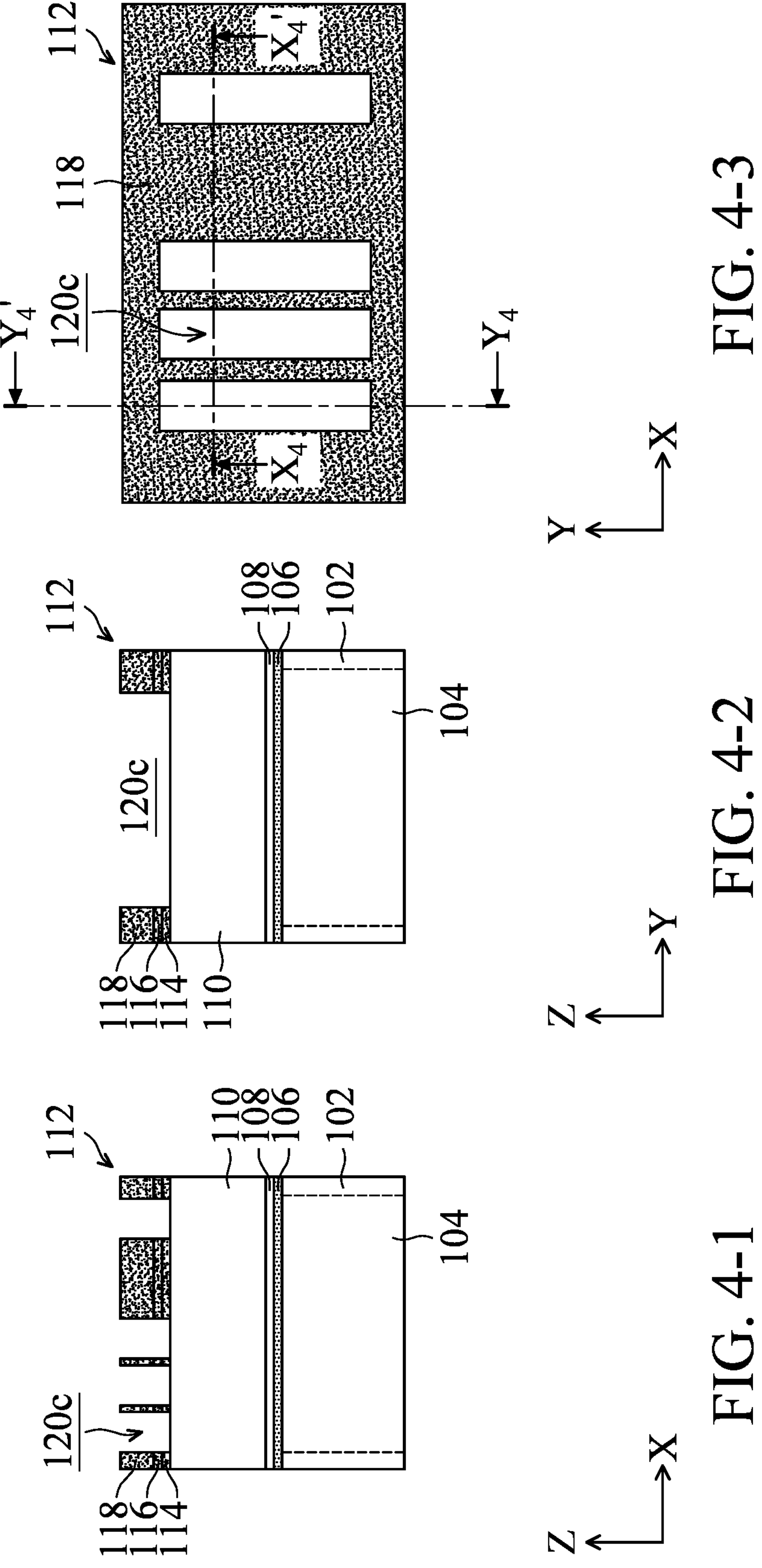

FIGS. 1A-1 to 1K-1 and 1A-2 to 1K-2 are cross-sectional representations of various stages of forming a semiconductor structure 100 in accordance with some embodiments. FIGS. 1A-3 to 1K-3 are top views of various stages of forming the semiconductor structure 100 in accordance with some embodiments. More specifically, FIGS. 1A-1 to 1K-1 illustrate the cross-sectional views of intermediate stages of manufacturing the semiconductor structure 100 shown along line $X_1$-$X_1$' (i.e. in the X direction) of FIGS. 1A-3 to 1K-3, and FIGS. 1A-2 to 1K-2 illustrate the cross-sectional views of intermediate stages of manufacturing the semiconductor structure 100 shown along line $Y_1$-$Y_1$' (i.e. in the Y direction) of FIGS. 1A-3 to 1K-3 in accordance with some embodiments. The X direction and the Y direction are generally orientated along the lateral (or horizontal) directions that are parallel to the main surface of the substrate. The Y direction is transverse (e.g., substantially perpendicular) to the X direction. The Z direction is generally oriented along the vertical direction that is perpendicular to the main surface of the substrate (or the X-Y plane).

As shown in FIGS. 1A-1 and 1A-2, a substrate 102 is formed in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP. In addition, the substrate 102 may include structures such as doped regions, interlayer dielectric (ILD) layers, conductive features, and/or isolation structures.

In some embodiments, the substrate 102 includes a device region 104, as shown in FIGS. 1A-1 and 1A-2. The device region 104 may have various device elements. Examples of device elements may include, but are not limited to, transistors, diodes, and other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and other applicable processes.

After the substrate 102 is formed, an interconnect structure may be formed over the substrate. More specifically, an aluminum-containing layer 106, an etch stop layer 108, a carbon-containing dielectric layer 110, and a mask structure 112 are sequentially stacked in the Z direction over the substrate 102, as shown in FIGS. 1A-1, 1A-2, and 1A-3 in accordance with some embodiments.

The aluminum-containing layer 106 may be configured to protect the elements (e.g. the elements in the device region 104) below it during the subsequent etching processes. By forming the aluminum-containing layer 106, the low k current may have a greater variation, and the result of time-dependent dielectric breakdown (TDDB) gamma test may also be improved (e.g. improve for more than 10%).

In some embodiments, the aluminum-containing layer 106 is made of AlN, AlON, AlO, or the like. In some embodiments, the thickness of the aluminum-containing layer 106 is in a range from about 10 Å to about 30 Å. The aluminum-containing layer 106 should be thick enough so it may protect the elements formed underneath during the subsequent etching processes. On the other hand, the aluminum-containing layer 106 should not be too thick or the capacitance of the resulting interconnect structure may be increased. In some embodiments, the dielectric constant of the aluminum-containing layer 106 is in a range from about 7 to about 8. If the dielectric constant of the aluminum-containing layer 106 is too low, the aluminum-containing layer 106 may not be densified enough to prevent over-etching during the etching process and the thickness of the aluminum-containing layer 106 may need to be increased. On the other hand, the dielectric constant of the aluminum-containing layer 106 should not be too high, or the capacitance of the resulting interconnect structure may be increased.

The etch stop layer 108 may be configured to show the stop point for the subsequent etching processes. In addition, since the aluminum-containing layer 106 with a greater hardness is formed first to protect the elements below it, the etch stop layer 108 does not need to be too thick. Furthermore, since the etch stop layer 108 has a relatively low dielectric constant, the total dielectric constant of the aluminum-containing layer 106 and the etch stop layer 108 can still be low enough, so that the capacitance of the resulting device will not be too high.

In some embodiments, the etch stop layer 108 and the aluminum-containing layer 106 are made of different dielectric materials. In some embodiments, the hardness of the etch stop layer 108 is lower than the hardness of the aluminum-containing layer 106. In some embodiments, the etch stop layer 108 is thicker than the aluminum-containing layer 106 in the Z direction. In some embodiments, the ratio of the thickness of the etch stop layer 108 to the thickness of the aluminum-containing layer 106 is in a range from about 2 to about 10. In some embodiments, the dielectric constant of the etch stop layer 108 is lower than the dielectric constant of the aluminum-containing layer 106.

In some embodiments, the etch stop layer 108 is made of a dielectric material that does not contain metal. In some embodiments, the etch stop layer 108 is made of SiOC, SiCN, SiBN, SiOCN, SiCBN, or the like. In some embodiments, the thickness of the etch stop layer 108 is in a range from about 60 Å to about 100 Å. The etch stop layer 108 should be thick enough so it will not be etched through too easily but should not be too thick or the capacitance of the resulting device may be increased. In some embodiments, the dielectric constant of the etch stop layer 108 is in a range from about 4 to about 4.8.

The carbon-containing dielectric layer 110 is a low k dielectric layer where the metal lines and conductive vias will be formed afterwards. In some embodiments, the atomic concentration of carbon in the carbon-containing dielectric layer 110 is in a range from about 15% to about 35%. By having enough amount of the carbon in the carbon-containing dielectric layer 110, the carbon-containing dielectric layer 110 can have a greater hardness while remaining a low dielectric constant. Therefore, the RC delay and the reliability of the resulting interconnect structure can be improved. In some embodiments, the carbon-containing dielectric layer 110 has a hardness in a range from about 2 Gpa to about 3 Gpa. By forming the metal lines and conductive vias in the harder low k dielectric layer, the reliability of the interconnect structure may be improved.

In some embodiments, the dielectric constant of the carbon-containing dielectric layer 110 is in a range from about 2.4 to about 2.8. In some embodiments, the carbon-containing dielectric layer 110 is made of SiOCH having a relatively high carbon concentration. In some embodiments, both the carbon-containing dielectric layer 110 and the etch stop layer 108 are made of dielectric materials containing carbon, but the atomic concentration of carbon in the carbon-containing dielectric layer 110 is greater than the atomic concentration of carbon in the etch stop layer 108.

The mask structure 112 may be made of a single or multiple material layers. In some embodiments, the mask structure 112 includes 2 to 5 material layers. In some embodiments, the mask structure 112 includes a first layer 114, a second layer 116 formed over the first layer 114, and a third layer 118 formed over the second layer. The first layer 114 may be configured to prevent the materials in the second layer 116 from diffusing into the carbon-containing dielectric layer 110 during subsequent thermal processes or cycles. In some embodiments, the first layer 114 is an anti-reflective coating layer. In some embodiments, the first layer 114 is made of silicon carbide (SiC) layer, silicon oxycarbide (SiOC) layer, silicon nitride (SiN) layer, one or more other suitable materials, or a combination thereof. The first layer 114 can be formed by using an applicable deposition process, such as a PVD process, a plating process, a CVD process, a spin-on process, one or more other applicable processes, or a combination thereof.

In some embodiments, the second layer 116 is made of a tungsten-based material, such as tungsten, tungsten carbide, tungsten nitride, tungsten boride, tungsten boron carbide, tungsten boron nitride, tungsten carbonitride, or the like. In some embodiments, the second layer 116 is made of TiN based material. The second layer 116 can be formed by using an applicable deposition process, such as a PVD process, a plating process, a CVD process, a spin-on process, one or more other applicable processes, or a combination thereof.

In some embodiments, the third layer 118 is made of silicon carbide (SiC) layer, silicon oxycarbide (SiOC) layer, silicon nitride (SiN) layer, one or more other suitable materials, or a combination thereof. The third layer 118 can be formed by using an applicable deposition process, such as a PVD process, a plating process, a CVD process, a spin-on process, one or more other applicable processes, or a combination thereof. In some embodiments, the third layer 118 is thicker than the first layer 114. In some other embodiments, the third layer 118 is omitted.

Next, the mask structure 112 may be patterned. More specifically, line openings 120 are formed in the mask structure 112, as shown in FIGS. 1B-1, 1B-2, and 1B-3 in accordance with some embodiments. The line openings 120 are longitudinally oriented in the Y direction and have the pattern of the metal lines that will be formed afterwards, as shown in FIG. 1B-3 in accordance with some embodiments.

First, a photoresist structure (not shown) may be formed overlying the mask structure 112. The photoresist structure may be a single layer of material, or a multi-layer structure including multiple sub-layers. The photoresist structure may be negative type or positive type. The photoresist structure may define trench patterns that can be transferred into the mask structure 12. One or more etching processes may then be performed to remove exposed portions of the third layer 118 and the second layer 116, as shown in FIGS. 1B-1, 1B-2, and 1B-3 in accordance with some embodiments. In some embodiments, the first layer 114 is also partially etched during the etching process. In some embodiments, the first layer 114 has a remaining thickness smaller than about 300 Å. After the mask structure 112 is patterned, the photoresist structure may be removed.

After the line openings 120 are formed, a resist structure 122 is formed over the mask structure 112, as shown in FIGS. 1C-1, 1C-2, and 1C-3 in accordance with some embodiments. In some embodiments, the resist structure 122 includes via openings 124. The via openings 120 are vertically overlap the trench openings 120 and have the pattern of the conductive vias that will be formed afterwards, as shown in FIG. 1C-3 in accordance with some embodiments. In some embodiments, the width of each of the via openings 124 in the X direction is substantially equal to the width of each of the line opening 120 in the X direction. In some embodiments, the width of each of the via openings 124 in the Y direction is smaller than the width of each of the line openings 120 in the Y direction.

The resist structure 122 may include multiple material layers. In some embodiments, the resist structure 122 includes a bottom layer, a middle layer, and a top layer. The bottom layer and the top layer may be made of organic material, and the middle layer may be made of a silicon-containing material. For example, the bottom layer is made of $C_xH_yO_z$, the middle layer is made of $SiC_xH_yO_z$, and the top layer is made of $C_xH_yO_z$.

The top layer may be a photo-sensitive layer (e.g., photoresist) capable of being patterned using a photolithography process. For example, the top layer also includes a photo-sensitive element, such as a photo-acid generator (PAG) that allows a photolithography process to be performed to pattern the top layer. The top layer may be negative type or positive type. The top layer may be exposed to a radiation beam in an exposure process, and developing, rinsing, and baking processes may be performed afterwards to form a pattern in the top layer. After the top layer is patterned, the pattern may be transferred to the middle layer, and the top layer may be removed. Afterwards, the pattern in the middle layer may then be transferred to the bottom layer to form the via openings 124, and the middle layer may then be removed. That is, the resist structure 122 shown in FIGS. 1C-1, 1C-2, and 1C-3 may be the bottom layer. The thicknesses of the bottom layer, the middle layer, and the top layer may be different. In some embodiments, the thickness of the bottom layer is in a range from about 200 nm to about 400 nm. In some embodiments, the thickness of the middle layer is in a range from about 20 nm to about 40 nm. In some embodiments, the thickness of the top layer is in a range from about 80 nm to about 200 nm.

After the resist structure 122 is formed, an etching process is performed to etch the carbon-containing dielectric layer 110, as shown in FIGS. 1D-1, 1D-2, and 1D-3 in accordance with some embodiments. More specifically, the via openings 124 extend into the carbon-containing dielectric layer 110 to form via openings 126 in the carbon-containing dielectric layer 110 in accordance with some embodiments. That is, the pattern of the via openings 124 may be transferred to the carbon-containing dielectric layer 110. In addition, the bottom surfaces of the via openings 126 may be in the middle portions of the carbon-containing dielectric layer 110, such that the bottom surface of each of the via openings 126 is lower that the top surface of the carbon-containing dielectric layer 110 and is higher than the bottom surface of the carbon-containing dielectric layer 110 in accordance with some embodiments. In some embodiments, the etching process includes dry chemical etching, remote plasma etching, wet etching, other applicable technique, and/or a combination thereof.

Next, the resist structure 122 is removed, as shown in FIGS. 1E-1, 1E-2, and 1E-3 in accordance with some embodiments. In some embodiments, the resist structure 122 is removed by using an ashing process or stripping process. In some embodiments, the ashing process uses oxygen plasma, carbon dioxide plasma, another suitable plasma, or a combination thereof.

After the resist structure 122 is removed, an etching process 128 is performed to etch the carbon-containing dielectric layer 110 through the line openings 120 in the mask structure 112 and through the via openings 126 in the carbon-containing dielectric layer 110, as shown in FIGS. 1F-1, 1F-2, and 1F-3 in accordance with some embodiments. FIG. 1F-4 illustrates an enlarged cross-sectional view of the semiconductor structure of region $R_{1F}$ shown in FIG. 1F-2 in accordance with some embodiments. More specifically, the portions of the first layer 114 of the mask structure 140 exposed by the line openings 120 are etched, and the portions of the carbon-containing dielectric layer 110 under the line openings 120 are then etched to form line trenches 130 in the upper portions of the carbon-containing dielectric layer 110 during the etching process 128, as shown in FIG. 1F-2 in accordance with some embodiments. In addition, the portions of the carbon-containing dielectric layer 110 under the via openings 126 are further etched to expose the aluminum-containing layer 106 during the etching process 128, as shown in FIGS. 1F-1 and 1F-2 in accordance with some embodiments.

As described previously, since the aluminum-containing layer 106 has a greater density (e.g. hardness) than that of the etch stop layer 108, the aluminum-containing layer 106 may not be etched through during the etching process 128. Therefore, the structures under the aluminum-containing layer 106 may be protected during the etching process 128. In some embodiments, the portions of the aluminum-containing layer 106 under the via openings 126 are also partially etched during the etching process 128, so that via openings 126' partially extend into the aluminum-containing layer 106, as shown in FIG. 1F-4. In some embodiments, the etching process 128 is a dry chemical etching, a remote plasma etching, a wet etching, other applicable technique, and/or a combination thereof.

Next, an etching process 132 is performed to etch through the aluminum-containing layer 106, as shown in FIGS. 1G-1, 1G-2, and 1G-3 in accordance with some embodiments. In some embodiments, the etching process 132 is different from the etching process 128. In some embodiments, the etching process 132 is milder than the etching process 128. For example, the etchant used in the etching process 132 may be different from the etchant used in the etching process 128. After the etching process 132 is performed, the via openings 126' further extend through the aluminum-containing layer 106 to form via openings 126" in accordance with some embodiments. The device region 104 is exposed by the via openings 126" in accordance with some embodiments.

In some embodiments, the line trenches 130 are longitudinally oriented in the Y direction, and the via openings 126" vertically overlap the line trenches 130, as shown in FIG. 1G-3. In some embodiments, the line trenches 130 and the via openings 126" have slope sidewalls. In some embodiments, the top width of each of the line trenches 130 is greater than its bottom width. Similarly, the top width of each of the via openings 126" is greater than its bottom width in accordance with some embodiments. In some embodiments, the top width of each of the via openings 126" in the Y direction is smaller than the top width of each of the line trenches 130 in the Y direction.

After the via openings 126" are formed, conductive structures may be formed in the carbon-containing dielectric layer 100. More specifically, a first barrier layer 134, a second barrier layer 136, and a conductive layer 138 are sequentially formed in the via openings 126" and line trenches 130, as shown in FIGS. 1H-1, 1H-2, and 1H-3 in accordance with some embodiments.

The formation of the first barrier layer 134 may improve the adhesion between the conductive structures and the elements adjacent to the conductive structures. In addition, the first barrier layer 134 may help to prevent the metal elements (e.g. Cu) in the conductive layer 138 formed afterwards from diffusing outside the conductive structures. Furthermore, the first barrier layer 134 may be formed by performing an atomic layer deposition (ALD) process, so that the thickness of the first barrier layer 134 can be relatively thin. In some embodiments, the first barrier layer 134 has a thickness in a range from about 5 Å to about 15 Å (i.e. in Z direction). Since the first barrier layer 134 is relatively thin, the resistance can be reduced. On the other hand, the first barrier layer 134 may not be too thin, or the metal elements may diffuse through the first barrier layer 134, and the performance of the resulting device may be undermined. In some embodiments, the first barrier layer 134 is made of a metal nitride, such as TaN or TiN.

The formation of the second barrier layer 136 may also prevent the diffusion of the metal elements (e.g. Cu) in the conductive layer 138 formed afterwards. In addition, the second barrier layer 136 is made of a metal, such as Ta, Ti, Co, or Ru, so that the second barrier layer 136 may have a lower resistance. In some embodiments, the second barrier layer 136 is thicker than the first barrier layer 134, so that the diffusion of the metal elements (e.g. Cu) in the conductive layer 138 may be prevented, while the resistance of the total barrier layer (including the first barrier layer 134 and the second barrier layer 136) can still be low.

In some embodiments, the second barrier layer 136 is formed by performing a physical vapor deposition (PVD) process. In some embodiments, the second barrier layer 136 has a thickness in a range from about 5 Å to about 35 Å (i.e. in Z direction). In some embodiments, the sum of the thicknesses of the first barrier layer 134 and the second barrier layer 136 is in a range from about 10 Å to about 40 Å (i.e. in Z direction).

After the first barrier layer 134 and the second barrier layer 136 are formed, the line trenches 130 and the via openings 126" are completely filled with the conductive layer 138, as shown in FIGS. 1G-1, 1G-2, and 1G-3 in accordance with some embodiments. In some embodiments, the conductive layer 138 is made of a metal, such as Cu, Ru, Co, or the like. In some embodiments, the conductive layer 138 is doped with additional dopants, such as Mn, Al, or the like. The dopants may help to reduce the diffusion of the metal (e.g. Cu) from the conductive layer 138, so that the reliability of the resulting device may be improved. In some embodiments, the atomic concentration of the dopants in the conductive layer 138 is in a range from about 0.5% to about 2%. The dopant concentration may not be too high, or the resistance may be increased. In some embodiments, the conductive layer 138 is formed by performing chemical vapor deposition (CVD), physical vapor deposition (PVD), atomic layer deposition (ALD), or other applicable processes.

Next, a polishing process, such as a CMP process, may be perform to form conductive structures 140 in the line trenches 130 and the via openings 126", as shown in FIGS. 1I-1, 1I-2, and 1I-3 in accordance with some embodiments. More specifically, the polishing process may be performed to remove the upper portions of the conductive layer 138, the second barrier layer 136, and the first barrier layer 134 and to completely remove the mask structure 112 in accordance with some embodiments. In some embodiments, the carbon-containing dielectric layer 110 is also partially removed during the polishing process.

The conductive structures 140 include conductive vias 142 formed in the via openings 126" in the lower portion of the carbon-containing dielectric layer 110 and metal lines 144 formed in the line trenches 130 in the upper portion of the carbon-containing dielectric layer 110, as shown in FIG. 1I-2 in accordance with some embodiments. In some embodiments, the metal lines 144 are longitudinally oriented in the Y direction, and the conductive vias 142 vertically overlap the metal lines 144, as shown in FIG. 1I-2. In some embodiments, the metal lines 144 and the conductive vias 142 have slope sidewalls in the cross-sectional views as shown in FIGS. 1I-1 and 1I-2. In some embodiments, the top width of each of the metal lines 144 is greater than its bottom width. Similarly, the top width of each of the conductive vias 142 is greater than its bottom width. In some embodiments, the top width of each of conductive vias 142 in the Y direction is smaller than the top width of each of the metal lines 144 in the Y direction.

In some embodiments, a sidewall 144X of the metal line 144 directly contacts a sidewall 142X of the conductive via 142 and the sidewall 144X of the metal line 144 and the sidewall 142X of the conductive via 142 extend in the same direction Dx in the cross-section shown in the X direction, as shown in FIG. 1I-1 in accordance with some embodiments. In some embodiments, the carbon-containing dielectric layer 110 has a slope sidewall, and the first barrier layer 134 covers the slope sidewall, as shown in FIG. 1I-1.

In some embodiments, a sidewall 144Y of the metal line 144 connects the top surface and the bottom surface of the metal line 144, and the bottom surface of the metal line 144 directly contacts a sidewall 142Y of the conductive via 142 in the cross-section shown in the Y direction, as shown in FIG. 1I-2 in accordance with some embodiments. However, since the metal line 144 and the conductive via 142 are formed simultaneously, there is no real interface between them.

After the conductive structures 140 are formed, processes shown in FIGS. 1A-1 to 1F-1, 1A-2 to 1F-2, and 1A-3 to 1F-3 are performed, as shown in FIGS. 1J-1, 1J-2, and 1J-3 in accordance with some embodiments. More specifically, an aluminum-containing layer 206, an etch stop layer 208, a carbon-containing dielectric layer 210, and a mask structure 212 (including a first layer 214, a second layer 216, and a third layer 218) are sequentially stacked over the carbon-containing dielectric layer 110, and line trenches 230 are formed in the upper portion of the carbon-containing dielectric layer 210 and via openings 226' are formed in the lower portion of the carbon-containing dielectric layer 210 in accordance with some embodiments. In some other embodiments, the mask structure 212 includes 2 to 5 material layers.

Processes and materials for forming the aluminum-containing layer 206, the etch stop layer 208, the carbon-containing dielectric layer 210, the mask structure 212 (including the first layer 214, the second layer 216, and the third layer 218), the line trenches 230, and the via openings 226' are similar to, or the same as, those for forming the aluminum-containing layer 106, the etch stop layer 108, the carbon-containing dielectric layer 110, the mask structure 112 (including the first layer 114, the second layer 116, and the third layer 118), the line trenches 130, and the via openings 126' described previously and are not repeated herein. As described previously, the aluminum-containing layer 206 may protect the conductive structures 140 formed under it during the etching process (similar to the etching process 128) for forming the via openings 226'. That is, the conductive structures 140 are not exposed by the via openings 226' in this step in accordance with some embodiments.

Afterwards, processes shown in FIGS. 1G-1 to 1I-1, 1G-2 to 1I-2, and 1G-3 to 1I-3 are performed, as shown in FIGS. 1K-1, 1K-2, and 1K-3 in accordance with some embodiments. More specifically, conductive structures 240, including a first barrier layer 234, a second barrier layer 236, and a conductive layer 238, are formed in accordance with some embodiments. In addition, the conductive structure 240 also includes metal lines 244 and conductive vias 242 in accordance with some embodiments. Processes and materials for forming the conductive structures 240, including the first barrier layer 234, the second barrier layer 236, and the conductive layer 238, are similar to, or the same as, those for forming the conductive structures 140, including the first barrier layer 134, the second barrier layer 136, and the conductive layer 138' described previously and are not repeated herein.

FIG. 1K-4 illustrates an enlarged cross-sectional view of the semiconductor structure of a region $R_{1K}$ shown in FIG. 1K-2 in accordance with some embodiments. During the formation of the conductive structures 240, the dopants (e.g. Mn) in the conductive layer 140 may diffuse to the periphery regions 140P of the conductive structures 140 in accordance with some embodiments. In some embodiments, the atomic concentration of the dopants in the periphery regions 140P is greater than the atomic concentration of the dopants in the middle regions 140M of the conductive structure 140 surrounded by the periphery regions 140P. The formation of the periphery regions 140P with a relatively higher atomic concentration of the dopants may help to reduce the amount of the metal (e.g. Cu) of the conductive layer diffusing out of the conductive structures 140, so that the reliability of the resulting device may be improved. In addition, since the diffusion of the metal may be reduced due to the formation of the higher-doped periphery regions 140P, the thickness of the barrier layer (i.e. the first barrier layer 134 and the second barrier layer 136) formed around the conductive layer 138 may be thinner, and the resistance may be reduced.

In some embodiments, the top region of the periphery regions 140P are in direct contact with the conductive structures 240 and the aluminum-containing layer 206. In some embodiments, the dopants further diffuse into the first barrier layer 134 and the second barrier layer 136, so that their ability of blocking the diffusion of the metal in the conductive layer 138 may be further improved, so the metal of the conductive layer 138 will not diffuse into the carbon-containing dielectric layer 110. In some embodiments, the amounts of the dopants diffuse into the first barrier layer 134 and the second barrier layer 136 is greater than the amounts of the dopants in the periphery regions 140P.

In addition, the dopants in the periphery regions 140P at the top portions of the conductive layer 140 may be blocked by the aluminum-containing layer 206, and therefore the dopants will not enter the carbon-containing dielectric layer 210 above. In some embodiments, the dopants in the conductive layer 140 further diffuse into the first barrier layer 234 and the second barrier layer 236. In some embodiments, addition conductive structures, similar to the conductive structures 140 and 240, may be formed over the conductive structures 240, and the conductive structures 240 and those formed over them may also have periphery regions having higher dopant concentrations. In some embodiments, the atomic concentration of the first barrier layer 236 at the bottom portion of the conductive via 242 in direct contact with the conductive layer 140 is greater than the atomic concentration of the first barrier layer 236 at the side portion of the conductive via 242 in direct contact with the carbon-containing dielectric layer 210.

As shown in FIG. 1K-2, the semiconductor structure 100 includes the conductive structures 140 and 240 formed in the carbon-containing dielectric layers 110 and 210 in accordance with some embodiments. As described previously, the hardness of the carbon-containing dielectric layers 110 and 210 may be relatively high, and therefore the reliability of the semiconductor structure 100 may be improved. In some embodiments, the top surfaces of the metal lines 144 and 244 are substantially level with the top surfaces of the carbon-containing dielectric layers 110 and 210. In some embodiments, the bottom surfaces of the aluminum-containing layers 106 and 206 are substantially level with the bottom surface of the first barrier layers 134 and 234.

In addition, the first barrier layers 134 and 234 and the second barrier layers 136 and 236 interpose the conductive layers 138 and 238 and the carbon-containing dielectric layers 110 and 220 in accordance with some embodiments. These barrier layers may prevent the metal of conductive layers 138 and 238 from diffusing into the carbon-containing dielectric layers 110 and 220, so that the reliability of the semiconductor structure 100 may be improved. In addition, the adhesion of the conductive structures 140 and 240 may be improved due to the formation of the first barrier layers 134 and 234. Furthermore, the resistance of the resulting device may be reduced.

Furthermore, the dopants in the conductive layers 138 and 238 are diffused to the periphery regions to form cap regions around the middle regions of the conductive structures 140 and 240, so that the diffusion of the metal, such as Cu, may be reduced.

In some embodiments, a first end of the first barrier layer 134 adjoins the bottom surface of the second aluminum-containing layer 206 and a second end of the first barrier layer 134 is substantially level with the bottom surface of the first aluminum-containing layer 106, as shown in FIG. 1K-1 in accordance with some embodiments. In some embodiments, the first carbon-containing dielectric layer 110 has a dimension $D_{110}$ (i.e. thickness) in the Z direction, the first etch stop layer 108 has a dimension $D_{108}$ (i.e. thickness) in the Z direction, the first aluminum-containing layer 106 has a dimension $D_{106}$ in the Z direction, dimension $D_{110}$ is greater than dimension $D_{108}$, and dimension $D_{108}$ is greater than dimension $D_{106}$. In some embodiments, the sum of dimension $D_{110}$, dimension $D_{108}$, and dimension $D_{106}$ is substantially equal to the distance between the top surface of the metal line 144 and the bottom surface of the first barrier layer 134 (i.e. the height $H_{140}$ of the conductive structure 140) in the Z direction. In some embodiments, the ratio of the height $H_{140}$ to the bottom width $W_{140}$ of the conductive structure in the X direction is in a range from about 2.5 to about 6. The conductive structures 240 may have the structure similar to those described above and the details are not repeated herein.

FIGS. 2-1 and 2-2 are cross-sectional views and FIGS. 2-3 is a top view of an intermediate stage of manufacturing the semiconductor structure 100 in accordance with some other embodiments. More specifically, FIG. 2-1 illustrates the cross-sectional view of the intermediate stages shown along line $X_2$-$X_2$' (i.e. in the X direction) of FIG. 2-3, and FIG. 2-2 illustrates the cross-sectional view of the intermediate stage shown along line $Y_2$-$Y_2$' (i.e. in the Y direction) of FIG. 2-3 in accordance with some embodiments.

Materials and processes for manufacturing the semiconductor structure 100 described above may be performed, except its via openings expose the top surface of the etch stop layer 108 in accordance with some embodiments. More specifically, processes shown in FIGS. 1A-1 to 1D-1, 1A-2 to 1D-2, and 1A-3 to 1D-3 are performed to form via openings **126*a* in accordance with some embodiments. In some embodiments, the via openings 126*a* expose the top surface of the etch stop layer 108. In some other embodiments, the via openings 126*a* extends into the etch stop layer 108. Afterwards, processes shown in FIGS. 1E-1 to 1K-1, 1E-2 to 1K-2, and 1E-3 to 1K-3 are performed to form the semiconductor structure 100. As described previously, since the aluminum-containing layer 106 has a relatively high hardness, the elements below it may be well-protected, even though the via openings 126*a* are etched to a greater depth, compared to those shown in FIGS. 1D-1 and 1D-2**.

FIGS. 3-1 and 3-2 are cross-sectional views and FIGS. 3-3 is a top view of an intermediate stage of manufacturing the semiconductor structure 100 in accordance with some other embodiments. More specifically, FIG. 3-1 illustrates the cross-sectional view of the intermediate stages shown along line $X_3$-$X_3$' (i.e. in the X direction) of FIG. 3-3, and FIG. 3-2 illustrates the cross-sectional view of the intermediate stage shown along line $Y_3$-$Y_3$' (i.e. in the Y direction) of FIG. 3-3 in accordance with some embodiments.

Materials and processes for manufacturing the semiconductor structure 100 described above may be performed, except its via openings expose the top surface of the aluminum-containing layer 106 in accordance with some embodiments. More specifically, processes shown in FIGS. 1A-1 to 1D-1, 1A-2 to 1D-2, and 1A-3 to 1D-3 are performed to form via openings **126*b* in accordance with some embodiments. In some embodiments, the via openings 126*b* expose the top surface of the aluminum-containing layer 106. Afterwards, processes shown in FIGS. 1E-1 to 1K-1, 1E-2 to 1K-2, and 1E-3 to 1K-3 are performed to form the semiconductor structure 100. As described previously, since the aluminum-containing layer 106 has a relatively high hardness, the elements below it may be well-protected, even though the via openings 126*b* are etched to a greater depth, compared to those shown in FIGS. 1D-1 and 1D-2**.

FIGS. 4-1 and 4-2 are cross-sectional views and FIGS. 4-3 is a top view of an intermediate stage of manufacturing the semiconductor structure 100 in accordance with some other embodiments. More specifically, FIG. 4-1 illustrates the cross-sectional view of the intermediate stages shown along line $X_4$-$X_4$' (i.e. in the X direction) of FIG. 4-3, and FIG. 4-2 illustrates the cross-sectional view of the intermediate stage shown along line $Y_4$-$Y_4$' (i.e. in the Y direction) of FIG. 4-3 in accordance with some embodiments.

Materials and processes for manufacturing the semiconductor structure 100 described above may be performed, except its line openings expose the top surface of the carbon-containing dielectric layer 110 in accordance with some embodiments. More specifically, processes shown in FIGS. 1A-1 to 1B-1, 1A-2 to 1B-2, and 1A-3 to 1B-3 are performed to form line openings 120*c* in the mask structure 112 in accordance with some embodiments. In some embodiments, the line openings 120*c* expose the top surface of the carbon-containing dielectric layer 110. Afterwards, processes shown in FIGS. 1C-1 to 1K-1, 1C-2 to 1K-2, and 1C-3 to 1K-3 are performed to form the semiconductor structure 100.

Figures 1, 2, 3, 5A:
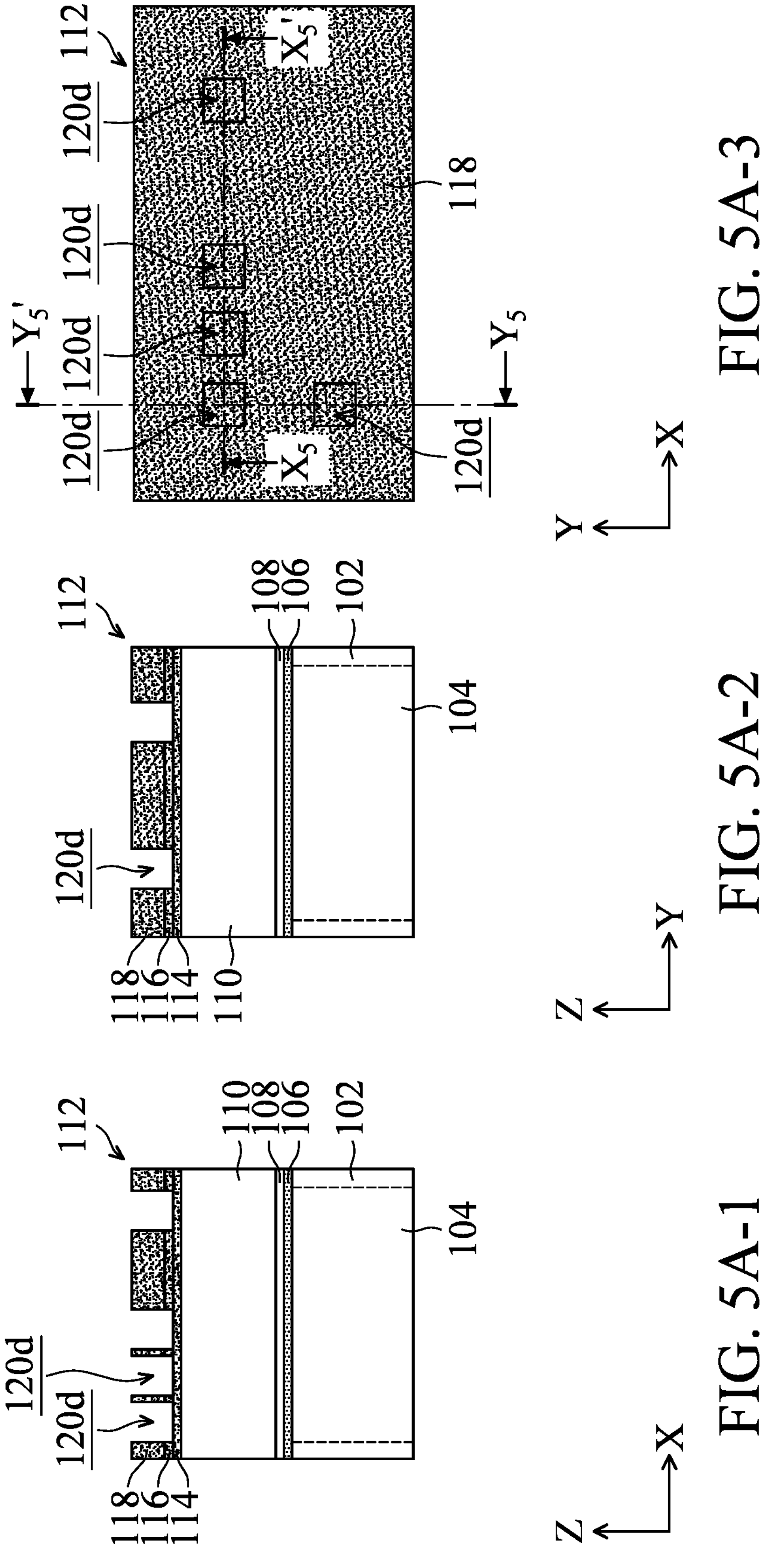
Figures 1, 2, 3, 5B:
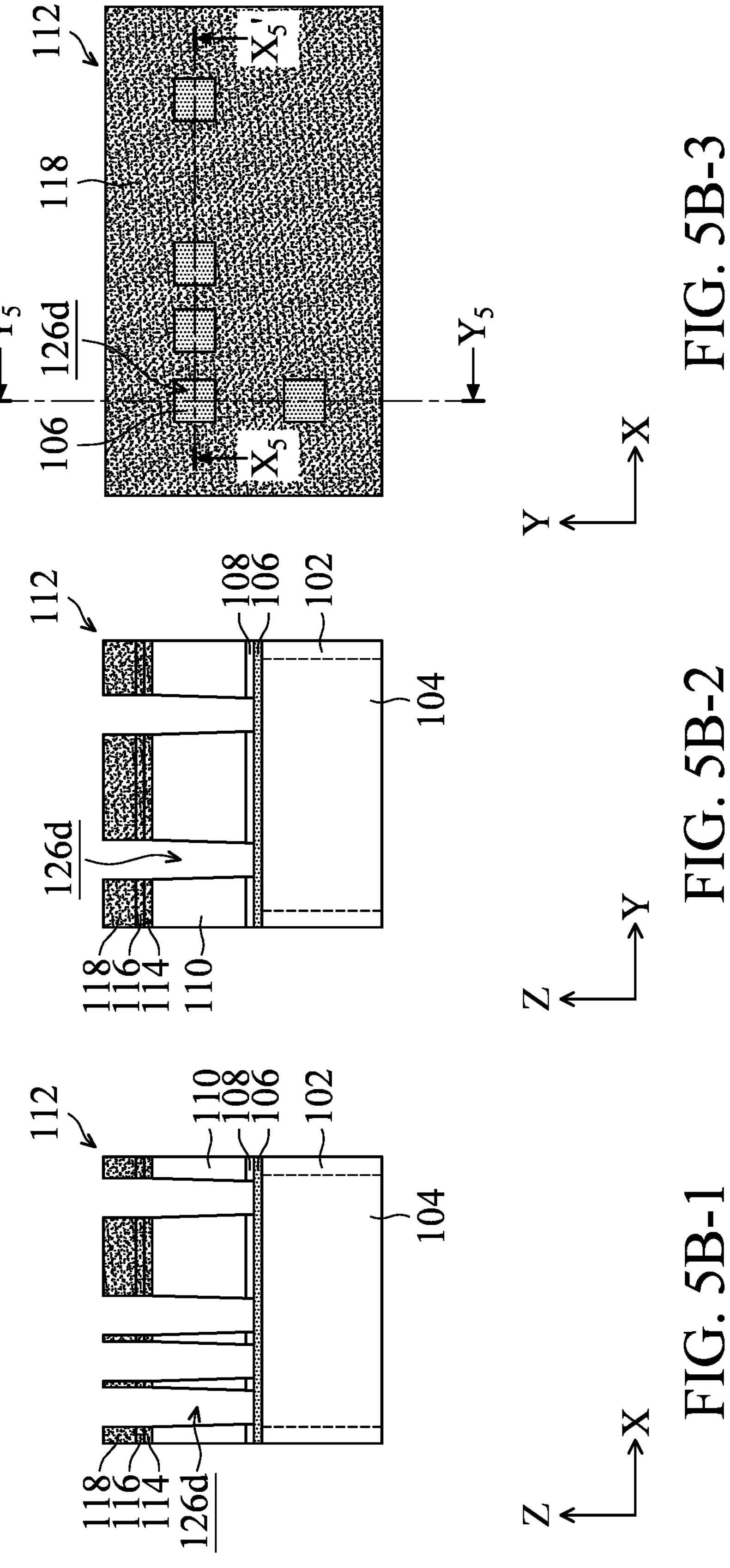
Figures 1, 2, 3, 5C:
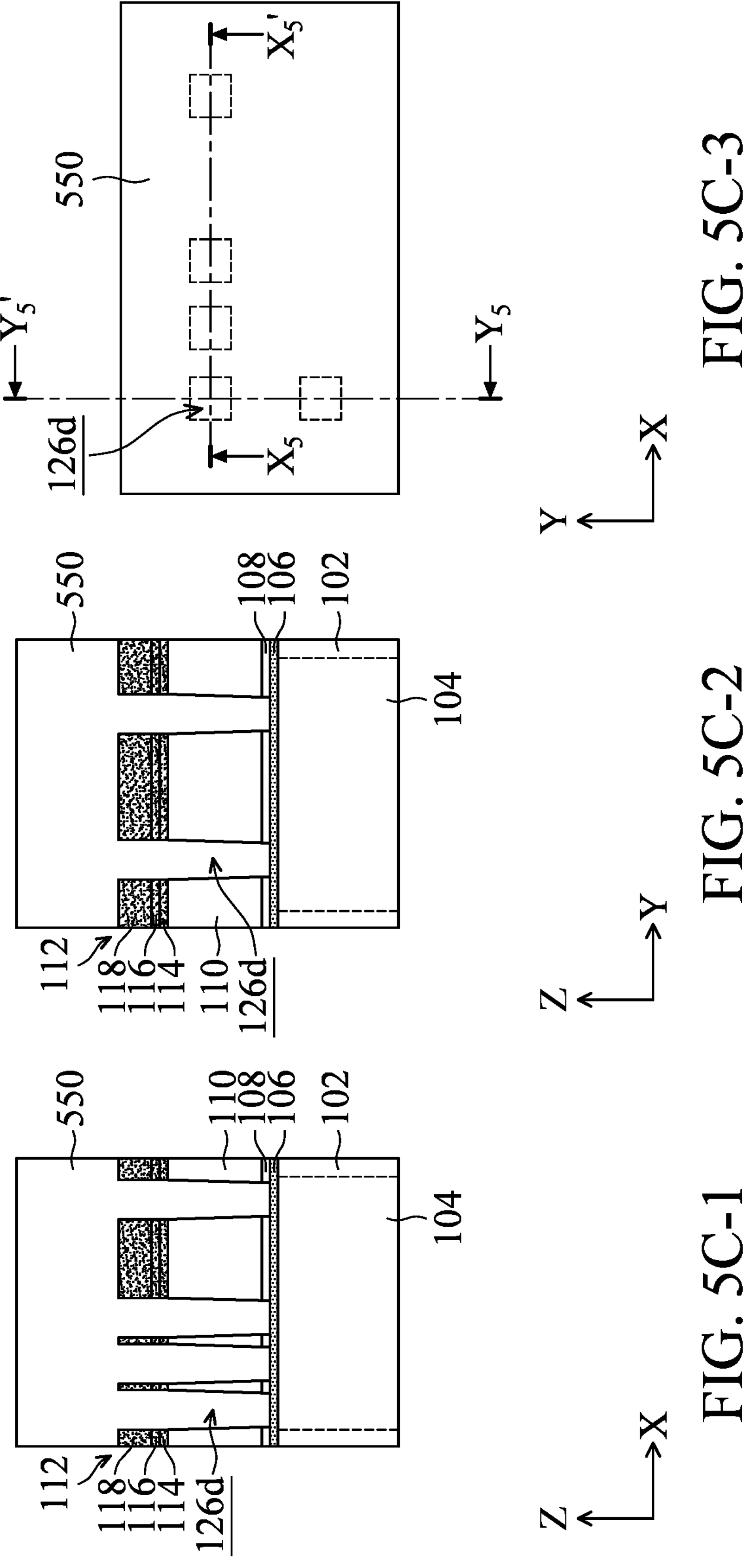
Figures 1, 2, 3, 5D:
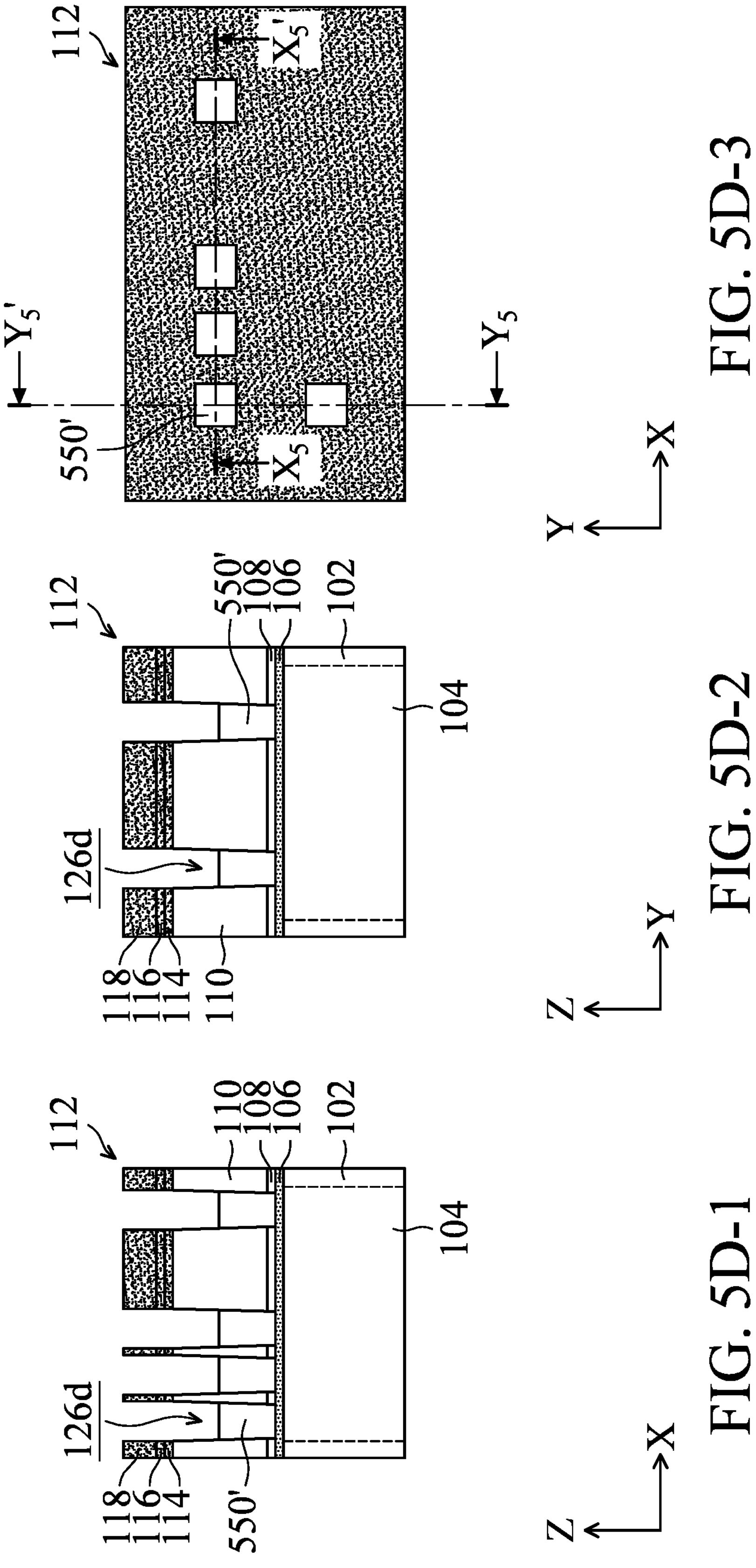
Figures 1, 2, 3, 5E:
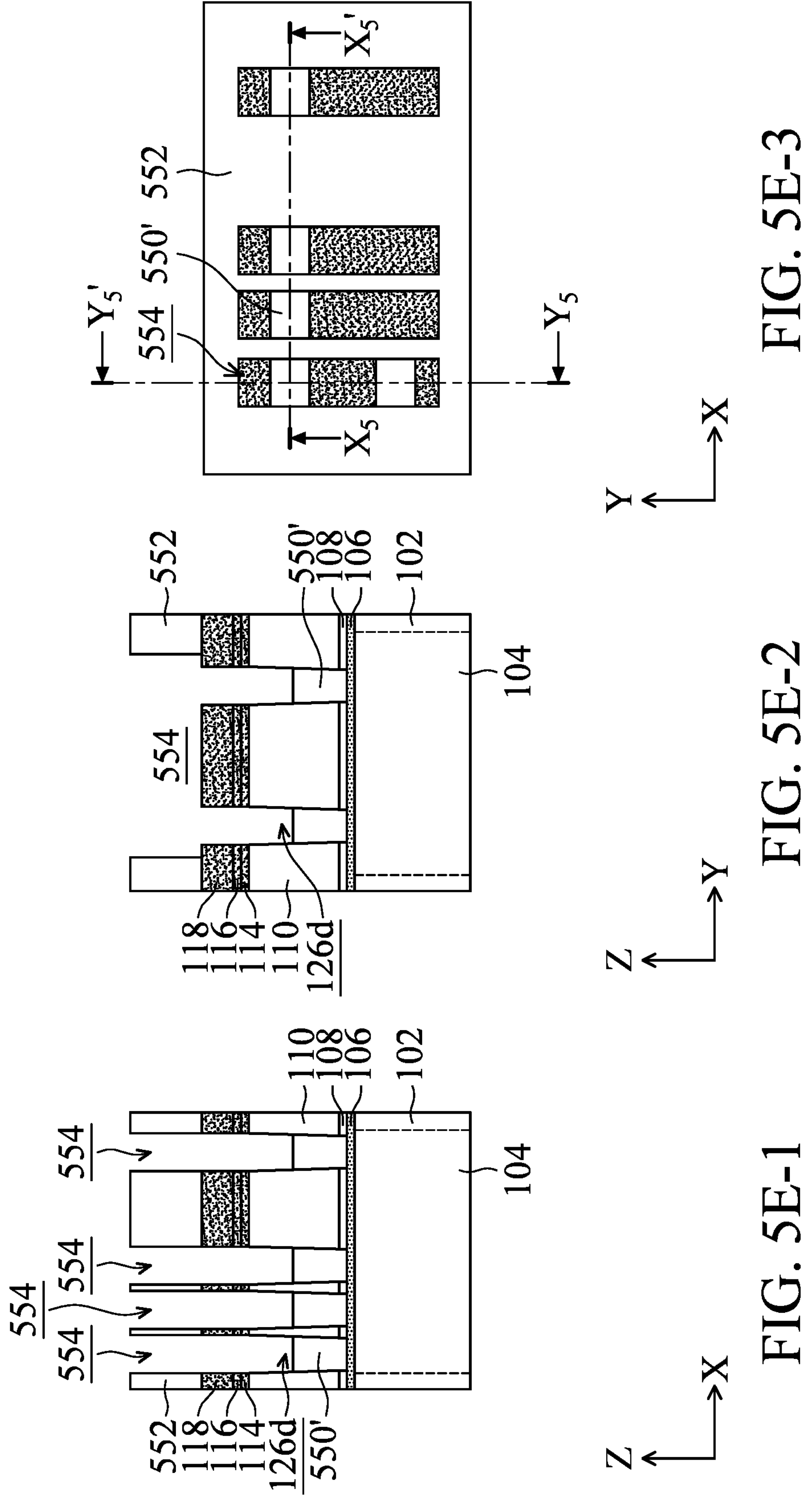
Figures 1, 2, 3, 5F:
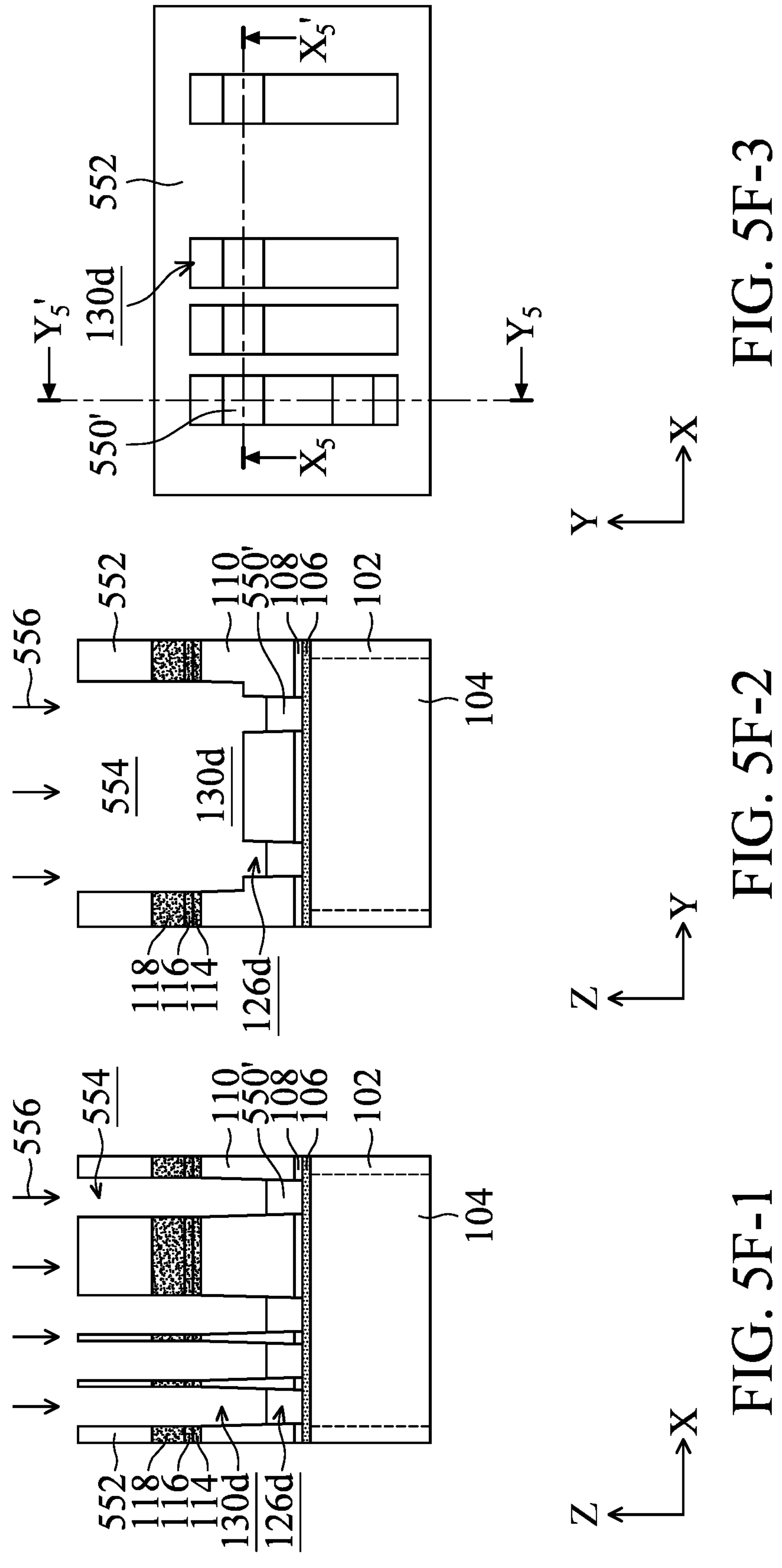
Figures 1, 2, 3, 5G:
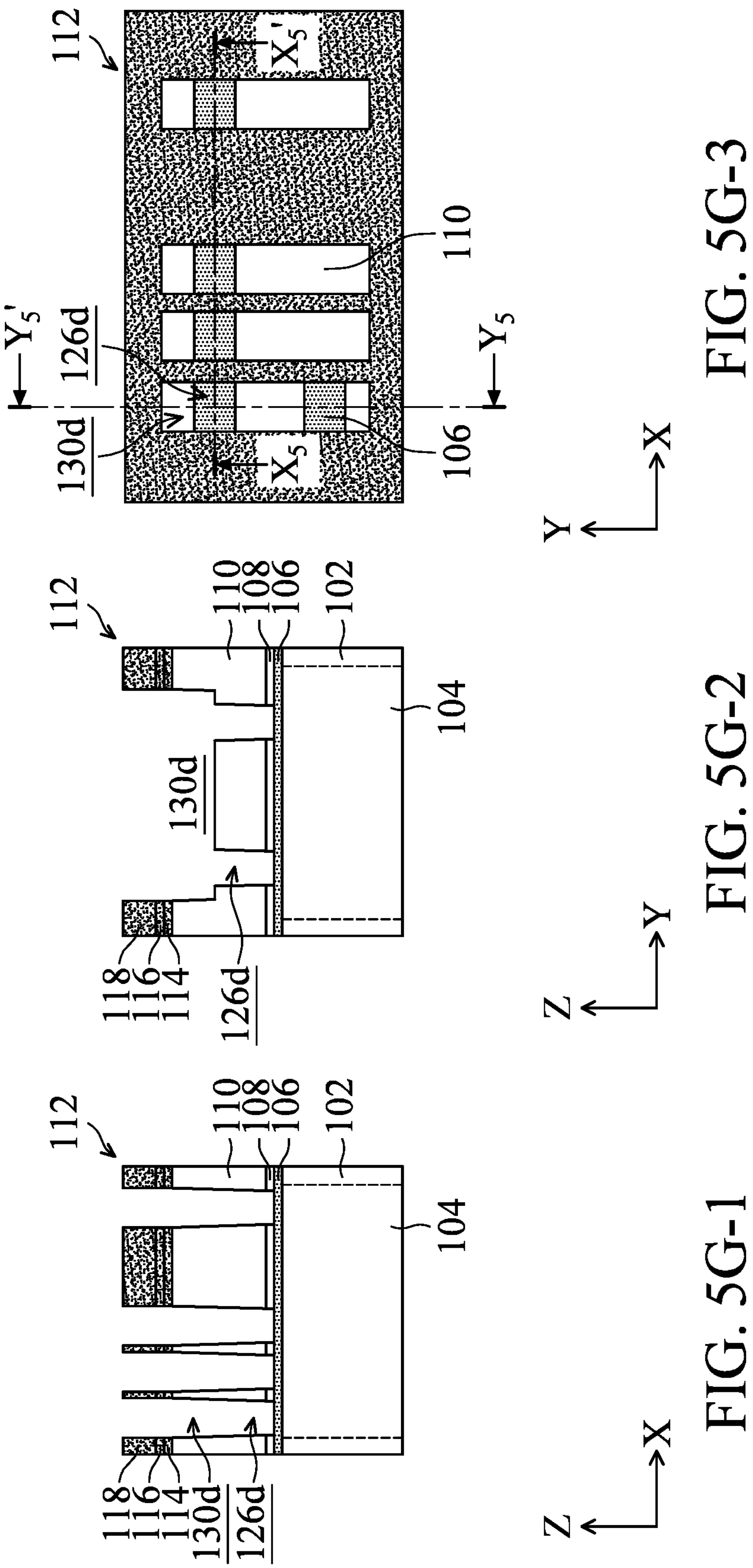
Figures 1, 2, 3, 5H:
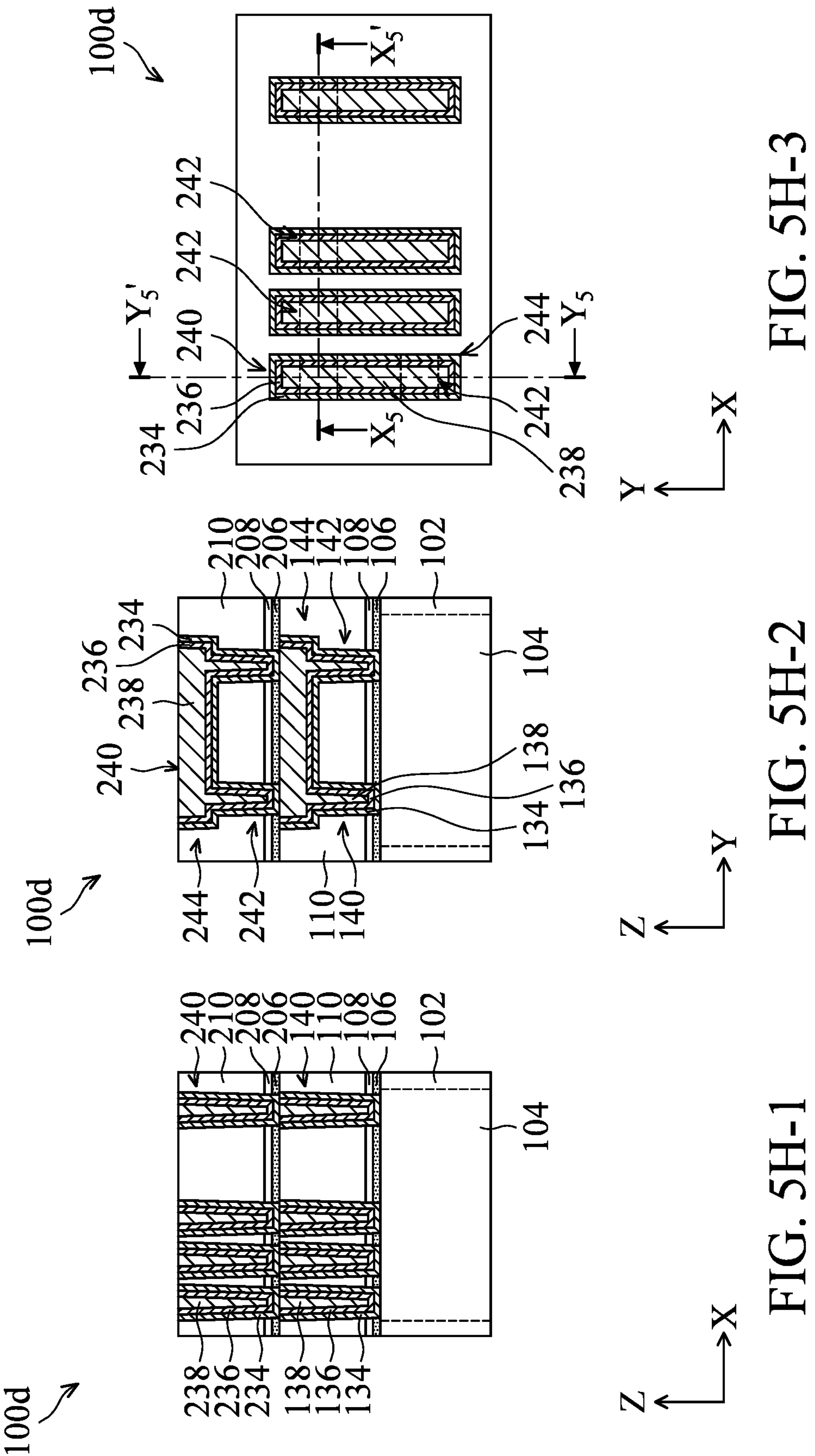

FIGS. 5A-1 to 5H-1 and 5A-2 to 5H-2 are cross-sectional representations of various stages of forming a semiconductor structure 100*d* in accordance with some embodiments. FIGS. 5A-3 to 5H-3 are top views of various stages of forming the semiconductor structure 100*d* in accordance with some embodiments. More specifically, FIGS. 5A-1 to 5H-1 illustrate the cross-sectional views of the intermediate stages of manufacturing the semiconductor structure 100*d* shown along line $X_5$-$X_5$' (i.e. in the X direction) of FIGS. 5A-3 to 5H-3, and FIGS. 5A-2 to 5H-2 illustrate the cross-sectional views of intermediate stages of manufacturing the semiconductor structure 100*d* shown along line $Y_1$-$Y_1$' (i.e. in the Y direction) of FIGS. 5A-3 to 5H-3 in accordance with some embodiments.

The semiconductor structure 100*d* may be similar to the semiconductor structure 100 described previously, although its via openings are patterned first during the manufacturing processes in accordance with some embodiments. Some processes and materials for forming the semiconductor structure 100*d* may be similar to, or the same as, those for forming the semiconductor structure 100 described previously and are not repeated herein.

More specifically, the processes shown in FIGS. 1A-1, 1A-2, and 1A-3 are performed, and via openings 120*d* are formed in the mask structure 112, as shown in FIGS. 5A-1, 5A-2, and 5A-3 in accordance with some embodiments. In some embodiments, the via openings 120*d* pass through the second layer 116 and the third layer 118 and expose the top surface of the first layer 114. The method for forming the via openings 120*d* may be the same as that for forming the line trenches 120, except the pattern of the via openings 120*d* is substantially the same as the conductive vias that will be formed afterwards.

Afterwards, the carbon-containing dielectric layer 110 is etched through the via openings 120*d* to form via openings 126*d* in the carbon-containing dielectric layer 110, as shown in FIGS. 5B-1, 5B-2, and 5B-3 in accordance with some embodiments. In addition, the via openings 126*d* extend through the etch stop layer 108 and expose the top surface of the aluminum-containing layer 106 in accordance with some embodiments. Similar to those described previously, the etching process may stop at the aluminum-containing layer 106, so that the elements (e.g. the device region 104) under it may be protected.

After the via openings 126*d* are formed, a blocking structure 550 is formed in the via openings 126*d* and over the mask structure 112, as shown in FIGS. 5C-1, 5C-2, and 5C-3 in accordance with some embodiments. In some embodiments, the blocking structure 550 is made of a dielectric material that has etching selective with the mask structure 112. In some embodiments, the blocking structure 550 is made of a resist material. In some embodiments, the blocking structure 550 is made of $C_xH_yO_z$.

Next, an etching-back process is performed to form plug structures 550', as shown in FIGS. 5D-1, 5D-2, and 5D-3 in accordance with some embodiments. More specifically, the blocking structure 550 covering the top surface of the mask structure 112 and in the upper portions of the via openings 126*d* are removed to form the plug structures 550' in the bottom portions of the via openings 126*d*, as shown in FIGS. 5D-1 and 5D-2. The etching process may be dry chemical etching, remote plasma etching, wet etching, other applicable technique, and/or a combination thereof.

After the plug structures 550' are formed, a resist structure 552 with line openings 554 is formed over the mask structure 112, as shown in FIGS. 5E-1, 5E-2, and 5E-3 in accordance with some embodiments. In some embodiments, the line openings 554 have the pattern of the metal lines that will be formed afterwards. In some embodiments, the line openings 554 vertically overlap the via openings 126*d*. The processes and materials form forming the resist structure 552 may be similar to, or the same as, those for forming the resist structure 124 described previously and are not repeated herein.

After the resist structure 552 is formed, an etching process 556 is performed to form line trenches 130*d* over the via openings 126*d*, as shown in FIGS. 5F-1, 5F-2, and 5F-3 in accordance with some embodiments. More specifically, the mask structure 112 and the upper portions of the carbon-containing dielectric layer 110 exposed by the line openings 554 are etched during the etching process 556, so that the line trenches 130*d* are formed in accordance with some embodiments. In some embodiments, the plug structures 550' are also partially etched during the etching process 556. In some embodiments, the etching process 556 is dry chemical etching, remote plasma etching, wet etching, other applicable technique, and/or a combination thereof.

Next, the resist structure 552 and the plug structures 550' are removed, as shown in FIGS. 5G-1, 5G-2, and 5G-3 in accordance with some embodiments. In some embodiments, the resist structure 552 and the plug structures 550' are removed by using an ashing process or stripping process. In some embodiments, the ashing process uses oxygen plasma, carbon dioxide plasma, another suitable plasma, or a combination thereof.

After the resist structure 552 and the plug structures 550' are removed, the processes shown in FIGS. 1G-1 to 1K-1, 1G-2 to 1K-2, and 1G-3 to 1K-3 are performed to form the semiconductor structure 100*d*, as shown in FIGS. 5H-1, 5H-2, and 5H-3 in accordance with some embodiments. Although the manufacturing processes are different, the structure of the semiconductor structure 100*d* may be similar to, or the same as, that of the semiconductor structure 100 described previously, and therefore the details of the structure of the semiconductor structure 100*d* are not repeated herein.

Figures 1, 2, 3, 6:
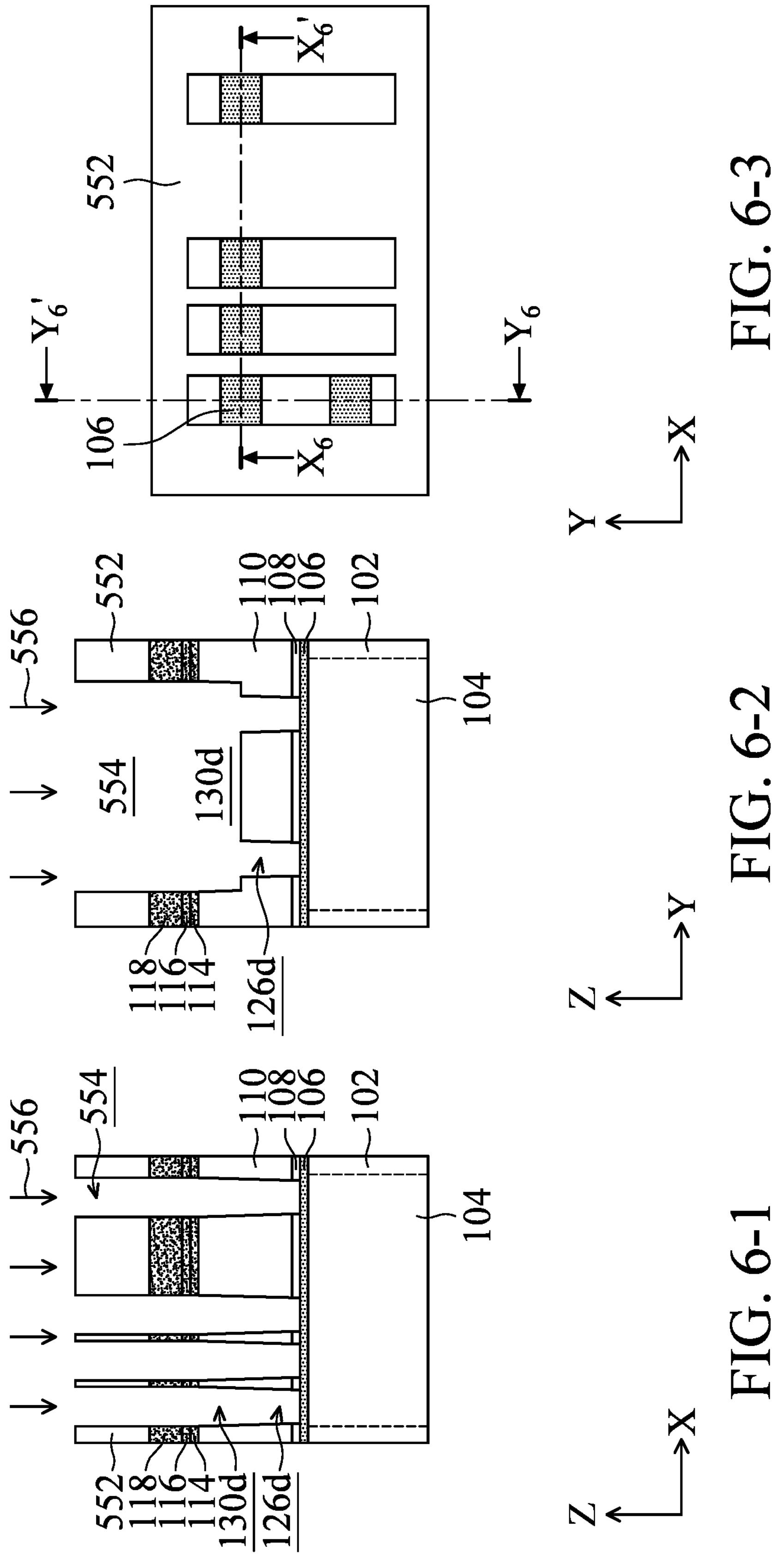

FIGS. 6-1 and 6-2 are cross-sectional views and FIGS. 6-3 is a top view of an intermediate stage of manufacturing the semiconductor structure 100*d* in accordance with some other embodiments. More specifically, FIG. 6-1 illustrates the cross-sectional view of the intermediate stages shown along line $X_6$-$X_6$' (i.e. in the X direction) of FIG. 6-3, and FIG. 6-2 illustrates the cross-sectional view of the intermediate stage shown along line $Y_6$-$Y_6$' (i.e. in the Y direction) of FIG. 6-3 in accordance with some embodiments.

Materials and processes for manufacturing the semiconductor structure 100*d* described above may be performed, except its plug structures are completely removed during the etching process 556 in accordance with some embodiments. More specifically, processes shown in FIGS. 5A-1 to 5F-1, 5A-2 to 5F-2, and 5A-3 to 5F-3 are performed to form line trenches 130*d* in accordance with some embodiments. In addition, the plug structures (e.g. the plug structures 550' shown in FIGS. 5E-1, 5E-2, and 5E-3) are completely removed during the etching process 556. Afterwards, processes shown in FIGS. 5G-1 to 5H-1, 5G-2 to 5H-2, and 5G-3 to 5H-3 are performed to form the semiconductor structure 100*d*.

Figures 1, 2, 3, 7:
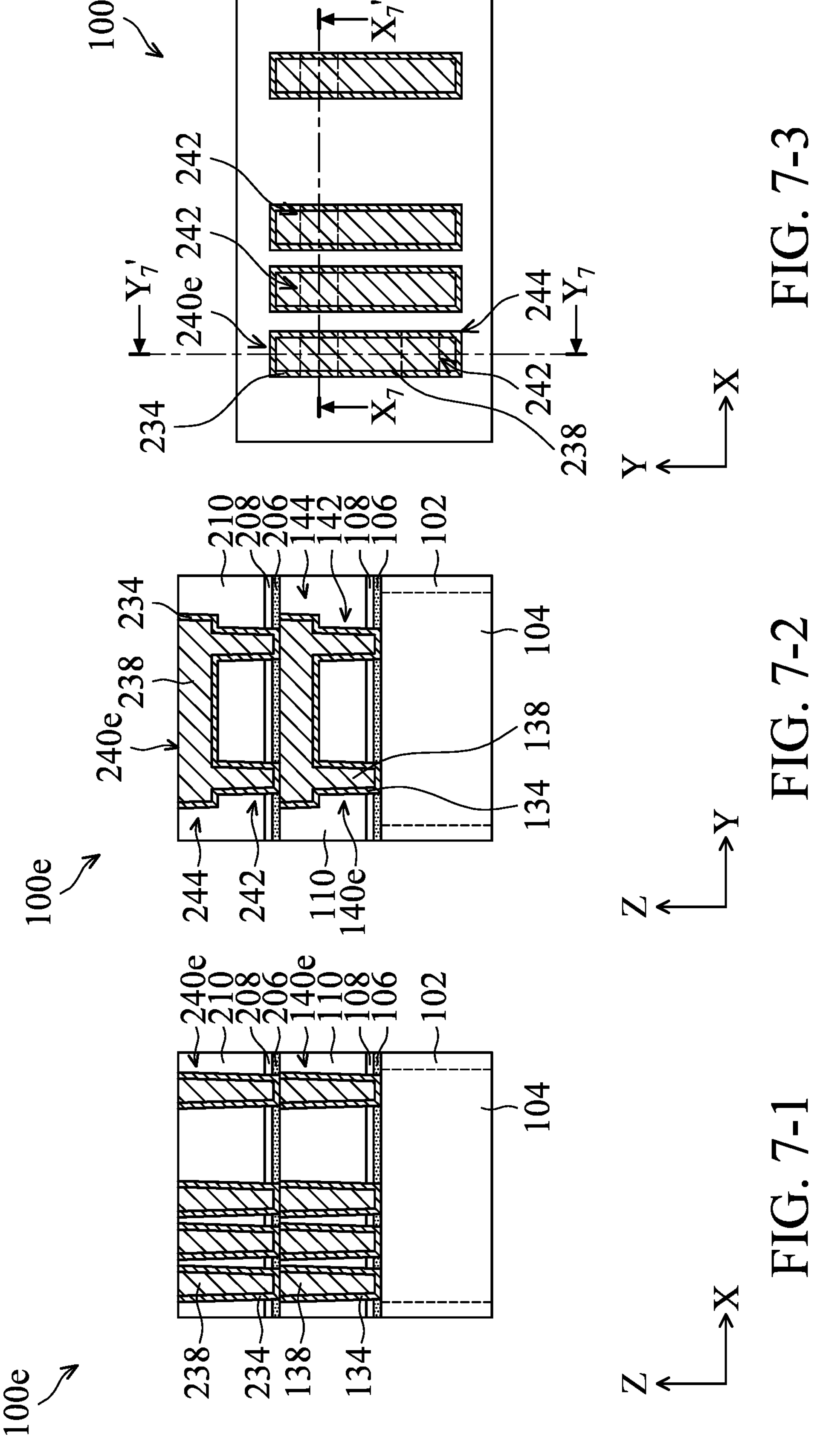

FIGS. 7-1 and 7-2 are cross-sectional views and FIGS. 7-3 is a top view of a semiconductor structure 100*e* in accordance with some other embodiments. More specifically, FIG. 7-1 illustrates the cross-sectional view of the semiconductor structure 100*e* shown along line $X_7$-$X_7$' (i.e. in the X direction) of FIG. 7-3, and FIG. 7-2 illustrates the cross-sectional view of the semiconductor structure 100*e* shown along line $Y_7$-$Y_7$' (i.e. in the Y direction) of FIG. 7-3 in accordance with some embodiments.

Materials and processes for manufacturing the semiconductor structure 100 or 100*d* described above may be performed, except a single barrier layer, instead of two barrier layers, is formed in the conductive structures in accordance with some embodiments. More specifically, after the line trenches (e.g. the line trenches 130 or 130*d*) and the via openings (e.g. the via openings 126" and 126*d*) are formed, the first barrier layer 134 is formed and the conductive layer 138 is directly formed over the first barrier layer 134, as shown in FIGS. 7-1, 7-2, 7-3, and 7-4 in accordance with some embodiments. Accordingly, each of conductive structures 140*e* includes the first barrier layer 134 and the conductive layer 138 in contact with the first barrier layer 134 in accordance with some embodiments. Similarly, each of conductive structures 240*e* includes the first barrier layer 234 and the conductive layer 238 in contact with the first barrier layer 234 in accordance with some embodiments.

Figures 2, 8:
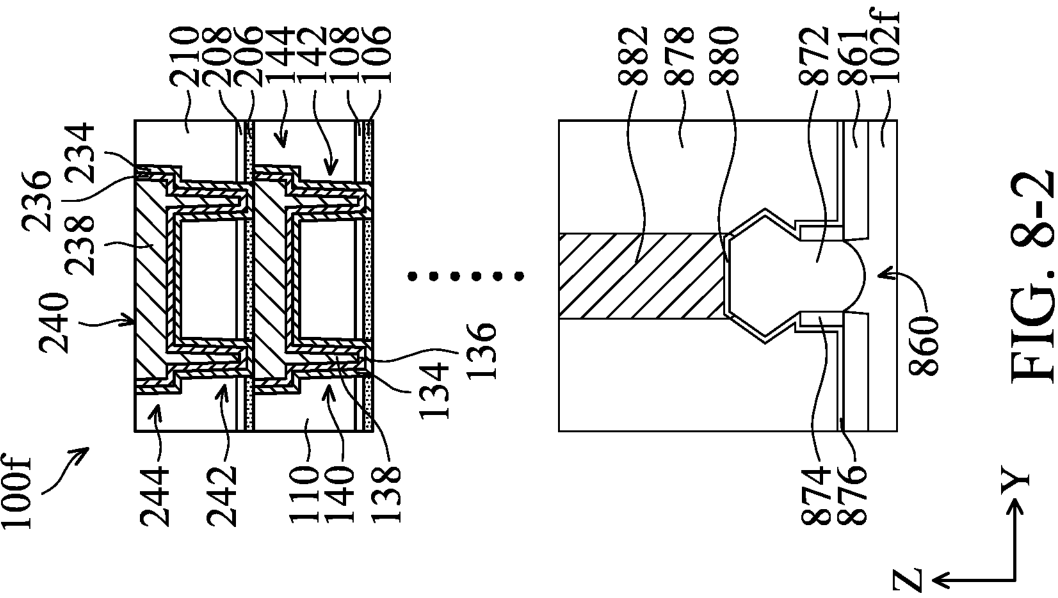
Figures 1, 8:
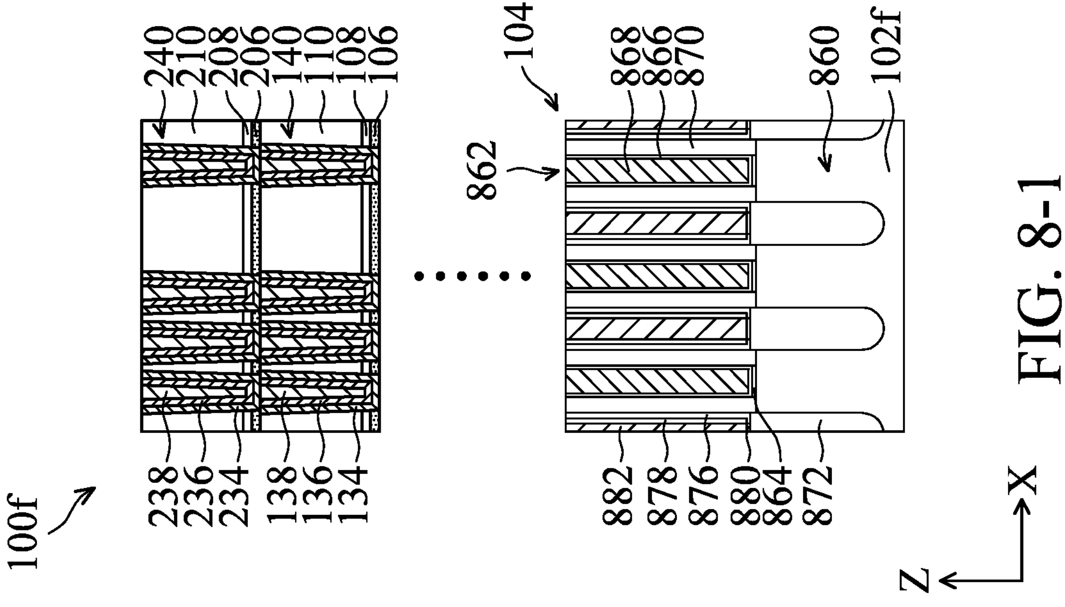

The device region 104 shown in FIGS. 1A-1 to 7-1 and 1A-2 to 7-2 may include various device elements. FIGS. 8-1 and 8-2 illustrate cross-sectional representations of a semiconductor structure 100*f* in accordance with some embodiments. In the semiconductor structure 100*f*, a device region 104*f* includes FinFET structures in accordance with some embodiments.

More specifically, the device region 104*f* includes a substrate 102*f*, a fin structure 860 protruding from the substrate 102*f*, an isolation structure 861 formed around the fin structure 860, gate structures 862 formed across the fin structure 860, gate spacers 870 formed over sidewalls of the gate structures 862, source/drain structures 872 formed at opposite sides of the gate structures 862 in the fin structure 860, source/drain spacers 874 formed on sidewalls of the source/drain structures 872, an contact etch stop layer (CESL) 876 formed over the source/drain structures 872, an interlayer dielectric (ILD) layer 878 formed over the contact etch stop layer 876, silicide layers 880 formed over the source/drain structures 872, and source/drain contacts 882 formed through the contact etch stop layer 876 and the interlayer dielectric layer 878 over the silicide layers 880, as shown in FIGS. 8-1 and 8-2 in accordance with some embodiments.

The substrate 102*f* may be the same as the semiconductor structure 102 described previously, and the fin structures 860 may be formed by patterning the substrate 102*f*. In addition, the fin structure 860 extends in the X direction in accordance with some embodiments.

In some embodiments, the isolation structure 861 is formed around the fin structure 860 in accordance with some embodiments. In some embodiments, the isolation structure 861 includes silicon oxide, silicon nitride, silicon oxynitride (SiON), another suitable insulating material, and/or a combination thereof. In some embodiments, the isolation structure 861 is formed using chemical vapor deposition (CVD) such as low pressure CVD (LPCVD), plasma enhanced CVD (PECVD), or high density plasma CVD (HDP-CVD), high aspect ratio process (HARP), flowable CVD (FCVD)); atomic layer deposition (ALD); another suitable method, and/or a combination thereof.

The gate structures 862 are formed across a channel region of the fin structure 860 and over the isolation structure 861 in accordance with some embodiments. In some embodiments, the gate structures 862 extend in the Y direction. That is, the gate structures 862 have longitudinal axes parallel to the Y direction in accordance with some embodiments. In some embodiments, each gate structure 862 includes an interfacial layer 864, a gate dielectric layer 866 formed on the interfacial layer 864, and a gate electrode layer 868 formed on the gate dielectric layer 866.

In some embodiments, the interfacial layer 864 is made of silicon oxide ($SiO_2$). In some embodiments, the interfacial layer 864 is formed by chemical oxidation, thermal oxidation, ALD, CVD, another suitable method, and/or a combination thereof.

In some embodiments, the gate dielectric layer 866 is made of a dielectric material with high dielectric constant (k value), for example, greater than 3.9. In some embodiments, the high-k dielectric material includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$(STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, another suitable material, and/or a combination thereof. The high-k gate dielectric layer may be formed by ALD, physical vapor deposition (PVD), CVD, thermal oxidation, and/or another suitable method.

In some embodiments, the gate electrode layer 868 includes a conductive material, such as doped semiconductor, metal, metal alloy, or metal silicide. In some embodiments, the gate electrode layer 868 includes a single layer or a multi-layer structure, such as various combinations of a metal layer with a selected work function to enhance the device performance (work function metal layer), a liner layer, a wetting layer, an adhesion layer, a metal fill layer, and/or another suitable layer. The gate electrode layer 868 may be made of doped polysilicon, doped poly-germanium, Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof. The gate electrode layer 868 may be formed by ALD, PVD, CVD, e-beam evaporation, or another suitable process.

In some embodiments, the gate spacers 870 are formed on the sidewalls of the gate structures 862. In some embodiments, the gate spacers 870 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacers 870 includes conformally depositing a dielectric material over the substrate 102*f* followed by an anisotropic etching process such as dry etching.

In some embodiments, the source/drain structures 872 are formed at opposite sides of the gate structures 862 in the fin structure 860. The formation of the source/drain structures 872 includes recessing the source/drain region of the fin structure 860 to form source/drain recesses on opposite sides of the gate structures 862 in accordance with some embodiments. Afterward, the source/drain structures 872 are grown in the source/drain recesses using an epitaxial growth process, in accordance with some embodiments. The epitaxial growth process may be molecular beam epitaxy (MBE), metal organic chemical vapor deposition (MOCVD), or vapor phase epitaxy (VPE), or another suitable technique. The source/drain structures 872 may refer to a source or a drain, individually or collectively dependent upon the context.

In some embodiments, the source/drain structures 872 are made of any suitable material, such as Ge, Si, GaAs, AlGaAs, SiGe, GaAsP, SiP, SiC, SiCP, or a combination thereof. In some embodiments, the source/drain structures 872 are in-situ doped during the epitaxial growth process. For example, the source/drain structures 872 may be the epitaxially grown SiGe doped with boron (B). For example, the source/drain structures 872 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features.

In some embodiments, the contact etch stop layer 876 is made of a dielectric materials, such as silicon nitride, silicon oxide, silicon oxynitride, another suitable dielectric material, or a combination thereof. The dielectric material for the contact etch stop layers 876 may be conformally deposited over the semiconductor structure by performing CVD, ALD, other application methods, or a combination thereof.

The interlayer dielectric layer 878 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layer 878 may be formed by chemical vapor deposition (CVD), physical vapor deposition, (PVD), atomic layer deposition (ALD), or other applicable processes. In some embodiments, the interlayer dielectric layer 878 and the carbon-containing dielectric layer 110 are made of the same material.

The silicide layers 880 may be formed by forming a metal layer over the top surface of the source/drain structures 872 and annealing the metal layer so the metal layer reacts with the source/drain structures 8722 to form the silicide layers 880. The unreacted metal layer may be removed after the silicide layers 880 are formed.

In some embodiments, the source/drain contacts 882 are made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

The source/drain contacts 882 may further include a liner and/or a barrier layer. For example, a liner (not shown) may be formed on the sidewalls and bottom of the contact trench. The liner may be made of silicon nitride, although any other applicable dielectric may be used as an alternative. The liner may be formed using a plasma enhanced chemical vapor deposition (PECVD) process, although other applicable processes, such as physical vapor deposition or a thermal process, may be used as an alternative. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

The interconnect structures described previously may be formed over the device region 104*f*, as shown in FIGS. 8-1 and 8-2 in accordance with some embodiments. The interconnect structures may electrically couples various components of devices (such as the source/drain contacts 882 and/or the gate structures 862) in accordance with some embodiments. It should be noted that the device region 104*f* shown in FIGS. 8-1 and 8-2 is merely an example, and other devices may be additionally or alternatively formed in the device region 104. In addition, some dielectric layers and conductive features may have been omitted in FIGS. 8-1 and 8-2 for clarity. Processes and materials for forming the interconnect structure in the semiconductor structure 100*f* may be similar to, or the same as, those for forming the interconnect structure in the semiconductor structure 100 or 100*d* described previously and are not repeated herein.

Figures 2, 9:
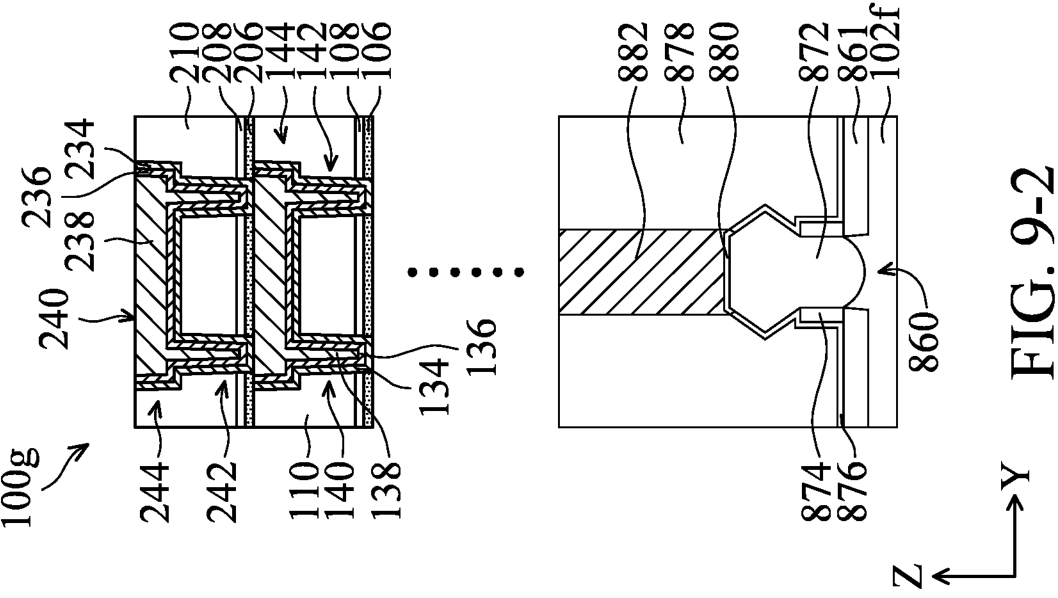
Figures 1, 9:
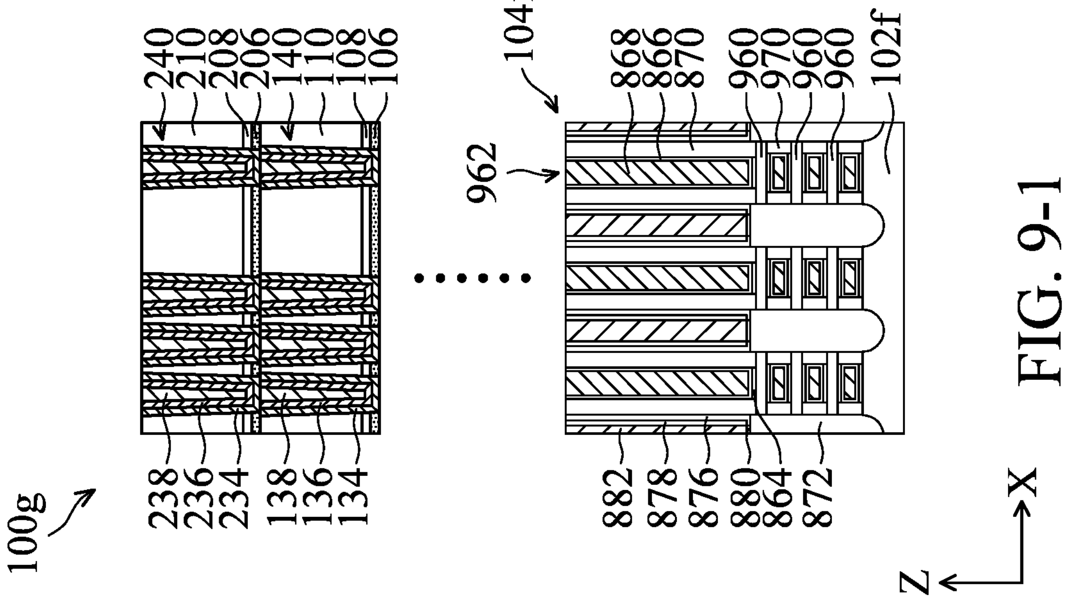

FIGS. 9-1 and 9-2 illustrate cross-sectional representations of a semiconductor structure 100*g* in accordance with some other embodiments. In the semiconductor structure 100*g*, a device region 104*g* includes gate-all-around (GAA) structures in accordance with some embodiments.

More specifically, the device region 104*g* may be similar to the device region 104*f* described above, except the device region 104*g* further includes channel layers 960 sandwiched between the source/drain structures 872, gate structures 962 wrapping around the channel layers 960, and inner spacers 970 interposing the gate structures 962 and the source/drain structures 872, as shown in FIGS. 9-1 and 9-2 in accordance with some embodiments.

In some embodiments, the channel layers 960 are made of pure or substantially pure silicon. The channel layers 960 may be nanostructures (e.g., nanowires or nanosheets) that function as channel of the semiconductor device. In some embodiments, each of the gate structures 962 includes the interfacial layers 864, the gate dielectric layer 866, and the gate electrode layer 868 wrapping around the channel layers 960. In some embodiments, the inner spacers 970 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

The interconnect structures described previously may be formed over the device region 104*g*, as shown in FIGS. 9-1 and 9-2 in accordance with some embodiments. The interconnect structures may electrically couples various components of devices (such as the source/drain contacts 882 and/or the gate structures 962) in accordance with some embodiments. It should be noted that the device region 104*g* shown in FIGS. 9-1 and 9-2 is merely an example, and other devices may be additionally or alternatively formed in the device region 104*g*. In addition, some dielectric layers and conductive features may have been omitted in FIGS. 9-1 and 9-2 for clarity. Processes and materials for forming the interconnect structure in the semiconductor structure 100*g* may be similar to, or the same as, those for forming the interconnect structure in the semiconductor structure 100 or 100*d* described previously and are not repeated herein.

Generally, conductive structures, including metal lines and conductive vias, are formed in low k dielectric layer so that the capacitance of the device can be reduced. However, the low k dielectric layer may be relatively soft and may be damaged during the manufacturing process, resulting in undermining the reliability of the device.

Accordingly, in some embodiments of the application, the conductive structures (e.g. the conductive structures 140, 140*e*, 240, and 240*e*) are formed in the carbon-containing dielectric layers (e.g. the carbon-containing dielectric layers 110 and 210) in accordance with some embodiments. As described previously, the hardness of the carbon-containing dielectric layers may be relatively high, and therefore the reliability of the semiconductor structures (e.g. the semiconductor structures 100, 100*d*, 100*e*, 100*f*, and 100*g*) may be improved. In addition, since the carbon-containing dielectric layers are low k dielectric materials, the capacitance of the semiconductor structures may remain low.

In addition, the first barrier layers (e.g. the first barrier layers 134 and 234) and the second barrier layers (e.g. the second barrier layers 136 and 236) interpose the conductive layers (e.g. the conductive layers 138 and 238) and the carbon-containing dielectric layers in accordance with some embodiments. These barrier layers may prevent the metal (e.g. Cu) of conductive layers from diffusing into the carbon-containing dielectric layers, so that the reliability of the semiconductor structure 100 may be improved. In addition, the adhesion of the conductive structures may be improved due to the formation of the first barrier layers. Furthermore, the resistance of the barrier layers may remain relatively low. Therefore, the RC delay of the resulting semiconductor structures may be reduced. For example, the capacitance of the device may be improved for about 4-10%, the device speed may be improved for about 0.5-1%, the power efficiency may be improved for about 1-2%, and the reliability (e.g. TDDB gamma) may be improved for more than 10%.

In some embodiments, the dopants in the conductive layers are diffused to the periphery regions to form cap regions around the middle regions of the conductive structures, so that the diffusion of the metal, such as Cu, may be reduced. In addition, the barrier layers formed around the conductive layer may therefore be thinner in accordance with some embodiments. For example, the second barrier layer may be omitted in some embodiments.

It should be appreciated that the elements shown in the semiconductor structures 100, 100*d*, 100*e*, 100*f*, and 100*g* may be combined and/or exchanged. For example, a semiconductor structures 100*f* and 100*g* may have the conductive structures the same as that shown in FIGS. 7-1, 7-2, and 7-3.

It should be noted that same elements in FIGS. 1A-1 to 9-2 may be designated by the same numerals and may include similar or the same materials and may be formed by similar or the same processes; therefore such redundant details are omitted in the interest of brevity. In addition, although the structures shown in FIGS. 1A-1 to 9-2 are described in relation to specific methods, it will be appreciated that the structures disclosed in FIGS. 1A-1 to 9-2 are not limited to the method but may stand alone as structures independent of the methods. Similarly, the methods shown in FIGS. 1A-1 to 9-2 are not limited to the disclosed structures but may stand alone independent of the structures.

Also, while disclosed methods are illustrated and described above as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms “approximately,” “substantially,” “substantial” and “about” describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments of a semiconductor structure and methods for forming the same are provided. The semiconductor structure includes a carbon-containing dielectric layer and a conductive structure is formed through the carbon-containing dielectric layer. The carbon-containing dielectric layer may be a low k material with a high hardness, so that the reliability of the resulting semiconductor structure may be improved.

In some embodiments, a semiconductor structure is provided. The semiconductor structure includes an aluminum-containing layer and an etch stop layer formed over the aluminum-containing layer. The semiconductor structure further includes a carbon-containing dielectric layer formed over the etch stop layer. In addition, the atomic concentration of carbon in the carbon-containing dielectric layer is in a range from about 15% to about 35%. The semiconductor structure further includes a metal line formed in an upper portion of the carbon-containing dielectric layer. In addition, the metal line has a top surface and a first sidewall connected to the top surface. The semiconductor structure further includes a conductive via formed in a lower portion of the carbon-containing dielectric layer and through the etch stop layer and the aluminum-containing layer. In addition, the conductive via has a second sidewall adjoining the first sidewall of the metal line. The semiconductor structure further includes a barrier layer interposing the first sidewall of the metal line and carbon-containing dielectric layer and interposing the second sidewall of the conductive via and the carbon-containing dielectric layer.

In some embodiments, a semiconductor structure is provided. The semiconductor structure includes a first aluminum-containing layer, a first etch stop layer, and a first carbon-containing dielectric layer sequentially stacked in a first direction over a substrate and a first metal line formed through an upper portion of the first carbon-containing dielectric layer and longitudinally oriented in a second direction that is different from the first direction. The semiconductor structure further includes a first conductive via formed through a lower portion of the carbon-containing dielectric layer, the first etch stop layer, and the first aluminum-containing layer and a first barrier layer covering a slope sidewall of the carbon-containing dielectric layer in a cross-sectional view along a third direction that is different from the first direction and the second direction.

In some embodiments, a method for manufacturing a semiconductor structure is provided. The method for manufacturing a semiconductor structure includes forming an aluminum-containing layer and forming an etch stop layer over the aluminum-containing layer. The method for manufacturing a semiconductor structure further includes forming a carbon-containing dielectric layer over the etch stop layer and forming a via opening and a line trench in the carbon-containing dielectric layer. In addition, the via opening passes through the etch stop layer and exposes the top surface of the aluminum-containing layer. The method for manufacturing a semiconductor structure further includes etching through the aluminum-containing layer so that the via opening extends through the aluminum-containing layer and forming a conductive structure in the via opening and the line trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

an aluminum-containing layer;

an etch stop layer formed over the aluminum-containing layer;

a carbon-containing dielectric layer formed over the etch stop layer, wherein an atomic concentration of carbon in the carbon-containing dielectric layer is in a range from about 15% to about 35%;

a metal line formed in an upper portion of the carbon-containing dielectric layer, wherein the metal line has a top surface and a first sidewall connected to the top surface;

a conductive via formed in a lower portion of the carbon-containing dielectric layer and through the etch stop layer and the aluminum-containing layer, wherein the conductive via has a second sidewall adjoining the first sidewall of the metal line; and a barrier layer interposing the first sidewall of the metal line and carbon-containing dielectric layer and interposing the second sidewall of the conductive via and the carbon-containing dielectric layer, wherein the metal line, the conductive via, and the barrier layer comprise a same dopant.

2. The semiconductor structure as claimed in claim 1, wherein a hardness of the carbon-containing dielectric layer is in a range from about 2 Gpa to about 3 Gpa.

3. The semiconductor structure as claimed in claim 1, wherein a top surface of the carbon-containing dielectric layer is substantially level with the top surface of the metal line.

4. The semiconductor structure as claimed in claim 3, wherein a bottom surface of the aluminum-containing layer is substantially level with a bottom surface of the barrier layer.

5. The semiconductor structure as claimed in claim 1, wherein the dopant is Mn.

6. A semiconductor structure, comprising:

a first aluminum-containing layer, a first etch stop layer, and a first carbon-containing dielectric layer sequentially stacked in a first direction over a substrate;

a first metal line formed through an upper portion of the first carbon-containing dielectric layer and longitudinally oriented in a second direction that is different from the first direction, wherein the first metal line comprises a periphery region and a middle region surrounded by the periphery region, an atomic concentration of first dopants in the periphery region is greater than an atomic concentration of the first dopants in the middle region;

a first conductive via formed through a lower portion of the first carbon-containing dielectric layer, the first etch stop layer, and the first aluminum-containing layer; and a first barrier layer covering a slope sidewall of the first carbon-containing dielectric layer in a cross-sectional view along a third direction that is different from the first direction and the second direction.

7. The semiconductor structure as claimed in claim 6, further comprising:

a second aluminum-containing layer formed over the first metal line, wherein a first end of the first barrier layer adjoins a bottom surface of the second aluminum-containing layer and a second end of the first barrier layer is substantially level with a bottom surface of the first aluminum-containing layer in the cross-sectional view along the third direction.

8. The semiconductor structure as claimed in claim 7, further comprising:

a second etch stop layer and a second carbon-containing dielectric layer formed over the second aluminum-containing layer;

a second metal line formed through an upper portion of the second carbon-containing dielectric layer;

a second conductive via formed through a lower portion of the second carbon-containing dielectric layer, the second etch stop layer, and the second aluminum-containing layer; and a second barrier layer surrounding the second metal line and the second conductive via, wherein the second barrier layer is in contact with the periphery region of the first metal line.

9. The semiconductor structure as claimed in claim 6, wherein the first conductive via has a first dimension in the second direction, and the first metal line has a second dimension in the second direction that is greater than the first dimension.

10. The semiconductor structure as claimed in claim 6, wherein the first carbon-containing dielectric layer has a third dimension in the first direction, the first etch stop layer has a fourth dimension in the first direction, the first aluminum-containing layer has a fifth dimension in the first direction, the third dimension is greater than the fourth dimension, and the fourth dimension is greater than the fifth dimension.

11. The semiconductor structure as claimed in claim 10, wherein a sum of the third dimension, the fourth dimension, and the fifth dimension is substantially equal to a distance between a top surface of the first metal line to a bottom surface of the first barrier layer in the first direction.

12. The semiconductor structure as claimed in claim 7, wherein a top portion of the periphery region of the first metal line is attached to the bottom surface of the second aluminum-containing layer.

13. A method for manufacturing a semiconductor structure, comprising:

forming an aluminum-containing layer;

forming an etch stop layer over the aluminum-containing layer;

forming a carbon-containing dielectric layer over the etch stop layer, wherein an atomic concentration of carbon in the carbon-containing dielectric layer is greater than 15%;

forming a via opening and a line trench in the carbon-containing dielectric layer, wherein the via opening passes through the etch stop layer and partially extends into the aluminum-containing layer, so that a bottom surface of the via opening is lower than a top surface of the aluminum-containing layer while is higher than a bottom surface of the aluminum-containing layer;

etching through the aluminum-containing layer so that the via opening extends through the aluminum-containing layer; and forming a conductive structure in the via opening and the line trench.

14. The method for manufacturing the semiconductor structure as claimed in claim 13, wherein forming the conductive structure in the via opening and the line trench comprises:

forming a first barrier layer over sidewalls of the via opening and the line trench by performing an atomic layer deposition process;

forming a second barrier layer over the first barrier layer by performing a physical vapor deposition process;

forming a conductive layer over the second barrier layer, wherein the conductive layer is doped with dopants; and polishing the first barrier layer, the second barrier layer, and the conductive layer to form the conductive structure.

15. The method for manufacturing the semiconductor structure as claimed in claim 14, wherein forming the conductive structure in the via opening and the line trench comprises:

diffusing the dopants so that a concentration of the dopants in a first region of the conductive structure is greater than a concentration of the dopants in a second region of the conductive structure.

16. The method for manufacturing the semiconductor structure as claimed in claim 13, further comprising:

forming a mask structure over the carbon-containing dielectric layer;

forming a first opening in the mask structure and longitudinally oriented in a first direction, wherein the first opening has a first dimension in the first direction;

forming a second opening in the carbon-containing dielectric layer overlapping the first opening after forming the first opening, wherein the second opening has a second dimension in the first direction that is smaller than the first dimension; and etching the carbon-containing dielectric layer through the first opening and the second opening to form the line trench and the via opening.

17. The method for manufacturing the semiconductor structure as claimed in claim 13, further comprising forming the via opening through the carbon-containing dielectric layer, wherein the via opening has a first dimension in a first direction;

forming a blocking structure in a bottom portion of the via opening;

etching the carbon-containing dielectric layer to form the line trench in the carbon-containing dielectric layer after forming the blocking structure, wherein the line trench has a second dimension in the first direction that is greater than the first dimension; and removing the blocking structure.

18. The method for manufacturing the semiconductor structure as claimed in claim 17, wherein the blocking structure is partially etched when etching the carbon-containing dielectric layer to form the line trench.

19. The method for manufacturing the semiconductor structure as claimed in claim 15, wherein the second region of the conductive structure is surrounded by the first region of the conductive structure.

20. The method for manufacturing the semiconductor structure as claimed in claim 15, wherein the conductive structure is doped with Mn.

* * * * *